US010784847B1

(12) United States Patent
Tandon et al.

(10) Patent No.: US 10,784,847 B1
(45) Date of Patent: Sep. 22, 2020

(54) DUTY CYCLE CORRECTION CIRCUIT

(71) Applicant: NXP B.V., Eindhoven (NL)

(72) Inventors: Prakhar Tandon, Hyderabad (IN); Shivesh Kumar Dubey, Hyderabad (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/836,869

(22) Filed: Mar. 31, 2020

(51) Int. Cl.
*H03K 5/156* (2006.01)
*H03L 7/06* (2006.01)

(52) U.S. Cl.
CPC ............ *H03K 5/1565* (2013.01); *H03L 7/06* (2013.01)

(58) Field of Classification Search
None
See application file for complete search history.

(56) References Cited

U.S. PATENT DOCUMENTS

| | | | |
|---|---|---|---|
| 6,426,660 B1 | 7/2002 | Ho et al. | |
| 6,967,514 B2 | 11/2005 | Kizer et al. | |
| 7,705,647 B2 | 4/2010 | Dai et al. | |
| 8,736,330 B2 * | 5/2014 | Chung ................. | H03K 5/1565 327/175 |
| 9,954,517 B2 * | 4/2018 | Ma ....................... | H03K 5/1565 |

OTHER PUBLICATIONS

Nikolic, B. et al. "Improved Sense-Amplifier-Based Flip-Flop: Design and Measurements", IEEE Journal of Solid-State circuits, vol. 35, No. 6, pp. 876-884 (Jun. 2000).
Frans, Y. et al. "Ä 40-to-64Gb/s NRZ Transmitter with Supply-Regulated Front-End in 16nm FinFET", Xilinx, ISSCC 2016 / Session 3 / Ultra-High-Speed Transceivers / 3.7, IEEE International Solid-State Circuits Conference, pp. 68-70 (2016).
Qiu, Y. et al. "1-5 GHz duty-cycle corrector circuit with wide correction range and high precision", Electronics Letters, vol. 50, No. 11, pp. 792-794 (May 2014).

* cited by examiner

*Primary Examiner* — Jeffrey S Zweizig
(74) *Attorney, Agent, or Firm* — Rajeev Madnawat

(57) ABSTRACT

A duty cycle correction circuit includes a duty cycle adjuster that is configured to receive first and second differential input signals having first and second duty cycles, respectively, that are distorted with respect to a reference duty cycle. The duty cycle adjuster is further configured to iteratively adjust the first and second duty cycles to generate first and second differential output signals having third and fourth duty cycles that are within a predefined range of the reference duty cycle, respectively. During each iteration, the duty cycle adjuster adjusts the first and second duty cycles based on correction bits that are generated based on a duty cycle detection signal that indicates whether the third duty cycle is greater than or less than the fourth duty cycle, and a lock signal that is activated when the duty cycle detection signal toggles from one logic state to another.

20 Claims, 6 Drawing Sheets

DUTY CYCLE CORRECTION CIRCUIT

BACKGROUND

The present disclosure relates generally to electronic circuits, and, more particularly, to a duty cycle correction circuit.

System-on-chips (SoCs) such as a Serializer/Deserializer, utilize clock signals for executing various functions of the SoCs. In an example, the clock signals are utilized to trigger synchronous circuits of an SoC. The clock signals, however, experience clock jitters due to variations in driving strengths of various transistors in the SoC that are utilized for communicating the clock signals to other components in the SoC. The jitters lead to distortion of a desired 50% of the duty cycle of the clock signal. Such distorted clock signals introduce inter symbol interference (ISI) in the SoC that leads to errors in an operation of the SoC and degrades a reliability of the SoC. For correcting the distorted duty cycles of the clock signals, a duty cycle correction circuit is implemented in the SoC.

A typical duty cycle correction circuit includes a detector that detects whether a distorted duty cycle is greater than or less than the desired duty cycle, and a corrector that consequently decreases or increases the distorted duty cycle, respectively, to correct the distorted duty cycle. The detector typically includes a charge pump, capacitors coupled with the charge pump, and a comparator coupled with the capacitors. The comparator compares the charge stored in the capacitors to determine whether the distorted duty cycle is greater than or less than the desired duty cycle. However, when a difference between the desired duty cycle and the distorted duty cycle is significantly small (e.g., 0.1%, 0.2%, or the like), a difference between the charge stored in the capacitors is significantly small. Thus, as the comparator needs to detect such small differences, an accuracy of the comparator is affected, thereby degrading an accuracy of the duty cycle correction circuit. The accuracy of the duty cycle correction circuit further decreases at high frequencies of operations of the SoC (i.e., for frequencies greater than 1 gigahertz). Further, the duty cycle correction circuit is operational as long as the SoC is operational. As a result, the duty cycle correction circuit, and in turn the SoC, consume a significant amount of power. Therefore, there exists a need for a system that solves the aforementioned problems of the conventional duty cycle correction circuits.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

Figure 1:
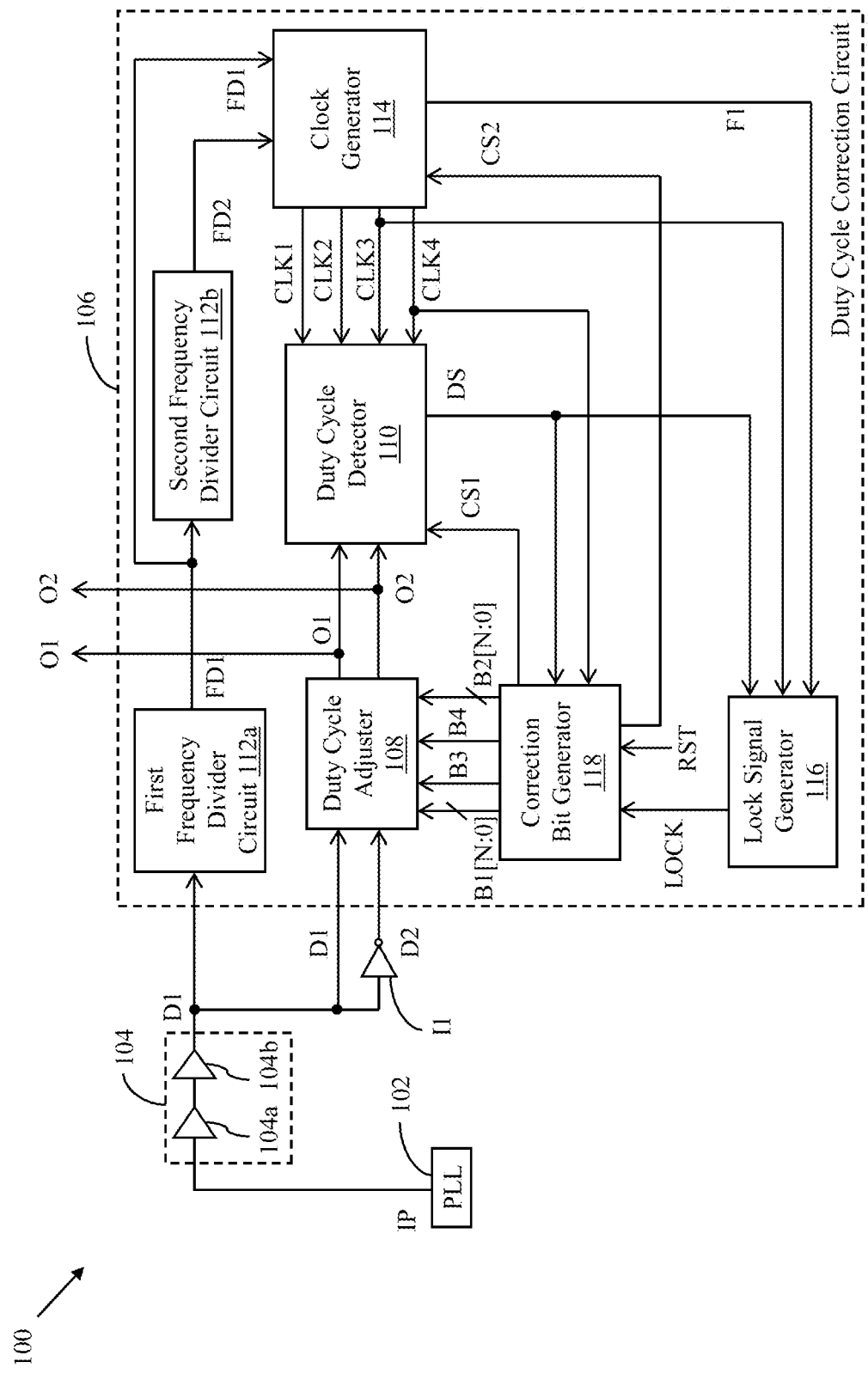
FIG. 1 is a schematic block diagram of a system-on-chip (SoC) in accordance with an embodiment of the present disclosure.

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

In one embodiment, a duty cycle correction circuit is provided. The duty cycle correction circuit includes a duty cycle adjuster, a lock signal generator, and a correction bit generator. The duty cycle adjuster is configured to receive and iteratively adjust first and second differential input signals having first and second duty cycles, respectively, based on a plurality of correction bits, to generate first and second differential output signals having third and fourth duty cycles, respectively. The lock signal generator is configured to receive a duty cycle detection signal that is generated based on a comparison of the first and second differential output signals. Based on the duty cycle detection signal, the lock signal generator is further configured to generate a lock signal. The lock signal is activated when the duty cycle detection signal toggles based on the third and fourth duty cycles, between a first logic state and a second logic state. The correction bit generator is configured to generate and adjust the plurality of correction bits based on the duty cycle detection signal and the lock signal, and provide the plurality of correction bits to the duty cycle adjuster.

In another embodiment, a system-on-chip (SoC) is provided. The SoC includes a phased locked loop (PLL), a set of buffers, and a duty cycle correction circuit. The PLL is configured to generate an input signal. The set of buffers is coupled with the PLL, and is configured to receive the input signal and generate a first differential input signal. The duty cycle correction circuit is coupled with the set of buffers. The duty cycle correction circuit includes a duty cycle adjuster, a lock signal generator, and a correction bit generator. The duty cycle adjuster is coupled with the set of buffers, and is configured to receive the first differential input signal and an inverted version of the first differential input signal. The first differential input signal and the inverted version of the first differential input signal have first and second duty cycles, respectively. The duty cycle adjuster is further configured to iteratively adjust the first differential input signal and the inverted version of the first differential input signal, based on the plurality of correction bits, to generate first and second differential output signals having third and fourth duty cycles, respectively. The lock signal generator is configured to receive a duty cycle detection signal and generate a lock signal. The duty cycle detection signal is generated based on a comparison of the first and second differential output signals. The lock signal is activated when the duty cycle detection signal toggles between a first logic state and a second logic state. The correction bit generator is configured to generate and iteratively adjust the plurality of correction bits based on the duty cycle detection signal and the lock signal, and provide the plurality of correction bits to the duty cycle adjuster.

Various embodiments of the present disclosure provide a duty cycle correction circuit that corrects duty cycle distortion. The duty cycle correction circuit includes a duty cycle adjuster that is configured to receive first and second differential input signals having first and second duty cycles, respectively, and multiple correction bits. The first and second duty cycles are distorted with respect to a reference duty cycle. The reference duty cycle may correspond to a 50% duty cycle. Based on the correction bits, the duty cycle adjuster is further configured to iteratively adjust the first and second differential input signals having first and second duty cycles to generate first and second differential output signals having third and fourth duty cycles, respectively, such that the third and fourth duty cycles are within a predefined range of the reference duty cycle. The duty cycle correction circuit further includes a lock signal generator that is configured to generate a lock signal based on a duty cycle detection signal. The duty cycle detection signal is generated based on a comparison of the third and fourth duty cycles of the first and second differential output signals, respectively. The lock signal is activated when the duty cycle detection signal toggles from at least one of a first logic state to a second logic state and the second logic state to the first logic state. The duty cycle correction circuit further includes a correction bit generator that is configured to generate and adjust the plurality of correction bits based on the duty cycle detection signal and the lock signal, and provide the plurality of correction bits to the duty cycle adjuster. Thus, the duty cycle correction circuit provides a closed loop duty cycle correction of the first and second differential input signals having distorted duty cycles. The correction of the duty cycle distortion reduces errors that are introduced in an operation of an SoC associated with the duty cycle correction circuit. Further, power consumed by the duty cycle correction circuit is less as compared to power consumed by conventional duty cycle correction circuits as components of the duty cycle correction circuit of the present disclosure are deactivated when not in use. Additionally, the duty cycle correction circuit of the present disclosure is capable of detecting a significantly small difference between the third and fourth duty cycles (e.g., 0.2%, 0.3%, or the like) and hence is implemented in SoCs that operate at high frequencies (e.g., frequencies greater than 1 gigahertz) for accurately correcting the duty cycle distortion.

Referring now to FIG. 1, a schematic block diagram of a system-on-chip (SoC) 100 in accordance with an embodiment of the present disclosure is shown. In one embodiment, the SoC 100 corresponds to a Serializer/Deserializer (SerDes). The SoC 100 includes a phase locked loop (PLL) 102, a set of buffers 104 of which first and second buffers 104*a* and 104*b* are shown, and a duty cycle correction circuit 106. In the presently preferred embodiment, the SoC 100 further includes a first inverter I1. In another embodiment, the first inverter I1 is external to the SoC 100.

The PLL 102 is configured to generate an input signal IP at a first phase that is based on a phase of a reference clock signal (not shown) of the SoC 100. The input signal IP has a reference duty cycle. In an example, the reference duty cycle corresponds to a 50% duty cycle.

The set of buffers 104 includes buffers (i.e., the first and second buffers 104*a* and 104*b*) that are coupled in series. The set of buffers 104 are coupled with the PLL 102, and is configured to receive the input signal IP. Each of the first and second buffers 104*a* and 104*b* includes a pair of complementary metal-oxide semiconductor (CMOS) inverters (not shown) that are coupled in series. Further, each CMOS inverter includes n-channel metal-oxide semiconductor (NMOS) and p-channel metal-oxide semiconductor (PMOS) transistors (not shown). The NMOS and PMOS transistors of each CMOS inverter may have different driving strengths which may distort the reference duty cycle of the input signal IP. The set of buffers 104 may thus be configured to generate a first differential input signal D1 having a first duty cycle that is different than the reference duty cycle. In an embodiment, the first duty cycle is greater than the reference duty cycle. In another embodiment, the first duty cycle is less than the reference duty cycle.

The first inverter I1 has an input terminal that is coupled with the set of buffers 104, and is configured to receive the first differential input signal D1 having the first duty cycle. The first inverter I1 further has an output terminal that is configured to output an inverted version of the first differential input signal D2, hereinafter referred to as "a second differential input signal D2". A second duty cycle of the second differential input signal D2 and the first duty cycle are thus complementary (i.e., the sum of the first and second duty cycles is equal to 100%).

The duty cycle correction circuit 106 is coupled with the set of buffers 104 and the first inverter I1, and is configured to receive the first and second differential input signals D1 and D2. The duty cycle correction circuit 106 is further configured to iteratively adjust the first and second duty cycles of the first and second differential input signals D1 and D2 to generate first and second differential output signals O1 and O2 having third and fourth duty cycles, respectively. The first and second differential output signals O1 and O2 may be provided to various circuitries of the SoC 100. In an embodiment, the first and second differential output signals O1 and O2 may be provided to a sampling circuit (not shown) of the SoC 100 for facilitating a sampling operation executed by the sampling circuit. The duty cycle correction circuit 106 includes a duty cycle adjuster 108, a duty cycle detector 110, first and second frequency divider circuits 112*a* and 112*b*, a clock generator 114, a lock signal generator 116, and a correction bit generator 118.

The duty cycle adjuster 108 is coupled with the set of buffers 104 and the first inverter I1, and is configured to receive the first and second differential input signals D1 and D2. The duty cycle adjuster 108 is further configured to receive multiple correction bits, of which first and second sets of correction bits B1[N:0] and B2[N:0] and third and fourth correction bits B3 and B4 are shown. The duty cycle adjuster 108 is further configured to iteratively adjust the first and second duty cycles based on the first and second sets of correction bits B1[N:0] and B2[N:0] and the third and fourth correction bits B3 and B4, to generate the first and second differential output signals O1 and O2 having the third and fourth duty cycles, respectively. The first and second duty cycles are iteratively adjusted by the duty cycle adjuster 108 until the third and fourth duty cycles are within a predefined range of the reference duty cycle (i.e., a difference between the third and fourth duty cycles is less than a predefined threshold value).

The predefined range of the reference duty cycle is determined based on a precision of the duty cycle correction circuit 106. The precision of the duty cycle correction circuit 106 defines a value by which the third and fourth duty cycles are increased or decreased during each iteration of the duty cycle adjustment that is executed by the duty cycle adjuster 108. In an example, when the precision is 0.2%, the third and fourth duty cycles are increased or decreased during each iteration by 0.2%. Further, in such a scenario, the predefined range is +/−0.1% of the reference duty cycle (i.e., 49.9% to 50.1% when the reference duty cycle is 50%) and the predefined threshold value is equal to the precision (i.e., 0.2%). The internal circuitry of the duty cycle adjuster 108 and the working of the duty cycle adjuster 108 is explained in detail in FIG. 2.

The duty cycle detector 110 is coupled with the duty cycle adjuster 108, and is configured to receive the first and second differential output signals O1 and O2. The duty cycle detector 110 is further configured to receive a first control signal CS1 and multiple clock signals, of which first through fourth clock signals CLK1, CLK2, CLK3, and CLK4 are shown. The first control signal CS1 controls an operation of the duty cycle detector 110. In an embodiment, when the first control signal CS1 is at a logic high state, the duty cycle detector 110 is activated (i.e., the duty cycle detector 110 is operational), and when the first control signal CS1 is at a logic low state, the duty cycle detector 110 is deactivated (i.e., the duty cycle detector 110 is non-operational). When the duty cycle detector 110 is operational, the duty cycle detector 110 is further configured to compare the third and fourth duty cycles, based on the first through fourth clock signals CLK1-CLK4, to generate a duty cycle detection signal DS. The duty cycle detection signal DS is thus generated based on a comparison of the third and fourth duty cycles of the first and second differential output signals O1 and O2, respectively. In an embodiment, when the third duty cycle is greater than the fourth duty cycle, the duty cycle detection signal DS is generated at a logic high state, and when the third duty cycle is less than the fourth duty cycle, the duty cycle detection signal DS is generated at a logic low state. The internal circuitry of the duty cycle detector 110 and the working of the duty cycle detector 110 is explained in detail in FIG. 3.

The first frequency divider circuit 112a is coupled with the set of buffers 104, and is configured to receive the first differential input signal D1. The first frequency divider circuit 112a is further configured to generate a first frequency divided signal FD1 by dividing a first frequency of the first differential input signal D1. The first frequency divided signal FD1 is generated such that a second frequency of the first frequency divided signal FD1 is less than the first frequency of the first differential input signal D1. The second frequency divider circuit 112b is coupled with the first frequency divider circuit 112a, and is configured to receive the first frequency divided signal FD1. The second frequency divider circuit 112b is further configured to generate a second frequency divided signal FD2 such that the second frequency is greater than a third frequency of the second frequency divided signal FD2.

The clock generator 114 is coupled with the first and second frequency divider circuits 112a and 112b, and is configured to receive the first and second frequency divided signals FD1 and FD2. The clock generator 114 is further configured to receive a second control signal CS2 that controls an operation of the clock generator 114. In an embodiment, when the second control signal CS2 is at a logic low state, the clock generator 114 is activated (i.e., the clock generator 114 is operational), and when the second control signal CS2 is at a logic high state, the clock generator 114 is deactivated (i.e., the clock generator 114 is non-operational). When the clock generator 114 is operational, the clock generator 114 is further configured to generate the first through fourth clock signals CLK1-CLK4 based on the first and second frequency divided signals FD1 and FD2. The first and second clock signals CLK1 and CLK2 are complementary signals. Similarly, the third and fourth clock signals CLK3 and CLK4 are complementary signals. The clock generator 114 is further configured to generate a first intermediate clock signal F1 based on the second frequency divided signal FD2. The internal circuitry of the clock generator 114 and the working of the clock generator 114 is explained in FIGS. 4A and 4B.

The lock signal generator 116 is coupled with the clock generator 114 and the duty cycle detector 110, and is configured to receive the first intermediate clock signal F1 and the duty cycle detection signal DS. The lock signal generator 116 is further configured to receive the third clock signal CLK3 from the clock generator 114. The first intermediate clock signal F1 controls an operation of the lock signal generator 116. In an embodiment, when the first intermediate clock signal F1 is at logic low and logic high states, the lock signal generator 116 is activated (i.e., the lock signal generator 116 is operational) and deactivated (i.e., the lock signal generator 116 is non-operational), respectively. When the lock signal generator 116 is operational, the lock signal generator 116 is further configured to generate a lock signal LOCK based on the duty cycle detection signal DS and the third clock signal CLK3. The lock signal LOCK is activated (i.e., the lock signal LOCK is at a logic high state) when the duty cycle detection signal DS toggles between logic high and logic low states (i.e., from at least one of a logic high state to a logic low state and a logic low state to a logic high state). The internal circuitry of the lock signal generator 116 and the working of the lock signal generator 116 is explained in detail in FIG. 5.

The correction bit generator 118 is coupled with the lock signal generator 116, the duty cycle detector 110, and the clock generator 114, and is configured to receive the lock signal LOCK, the duty cycle detection signal DS, and the fourth clock signal CLK4. The correction bit generator 118 is further configured to receive a reset signal RST. The reset signal RST may be generated by a system controller (not shown) of the SoC 100 for controlling an operation of the correction bit generator 118. In an embodiment, when the reset signal RST is at logic high and logic low states, the correction bit generator 118 is activated (i.e., the correction bit generator 118 is operational), and deactivated (i.e., the correction bit generator 118 is non-operational), respectively. When the correction bit generator 118 is operational, the correction bit generator 118 is further configured to generate and provide to the duty cycle adjuster 108, the first and second sets of correction bits B1[N:0] and B2[N:0] and the third and fourth correction bits B3 and B4 based on the duty cycle detection signal DS and the lock signal LOCK. The first and second sets of correction bits B1[N:0] and B2[N:0] are complementary bits and the third and fourth correction bits B3 and B4 are complementary bits. In an embodiment, the correction bit generator 118 generates the first and second sets of correction bits B1[N:0] and B2[N:0] and the third and fourth correction bits B3 and B4 at a negative clock edge of the fourth clock signal CLK4.

The first and second sets of bit values of the first and second sets of correction bits B1[N:0] and B2[N:0], respectively are iteratively adjusted when the lock signal LOCK is deactivated (i.e., when the lock signal LOCK is at a logic low state). The values are adjusted based on a thermometric code such that a difference between the third and fourth duty cycles decreases after each iteration of the duty cycle adjustment. In an embodiment, when the third duty cycle is greater than the fourth duty cycle, the thermometric code corresponds to sequentially activating each bit of the first set of correction bits B1[N:0] and consequently deactivating each bit of the second set of correction bits B2[N:0]. Thus, after each iteration, a number of bits of the first set of correction bits B1[N:0] that are activated and a number of bits of the second set of correction bits B2[N:0] that are deactivated increase. In an example, after each iteration, the number of bits of the first set of correction bits B1[N:0] that are activated and the number of bits of the second set of correction bits B2[N:0] that are deactivated are incremented by 1. The increase in the number of bits of the first and second sets of correction bits B1[N:0] and B2[N:0] that are activated and deactivated, respectively, results in an increase in an amount of adjustment of the first and second duty cycles. In an example, the increase in the amount of adjustment of the first and second duty cycles is equal to the precision of the duty cycle correction circuit 106. In other words, the difference between the third and fourth duty cycles decreases with the increase in the number of bits of the first and second sets of correction bits B1[N:0] and B2[N:0] that are activated and deactivated, respectively.

The lock signal LOCK is activated when the duty cycle detection signal DS toggles from a logic high state to a logic low state. In other words, the lock signal LOCK is activated when the third duty cycle is less than the fourth duty cycle. Thus, the first and second sets of bit values associated with an iteration that is immediately previous to an iteration associated with the activation of the lock signal LOCK are provided to the duty cycle adjuster 108 to ensure that the difference between the third and fourth duty cycles is less than the predefined threshold value. For example, if the lock signal LOCK is activated during an $n^{th}$ iteration, the first and second sets of bit values associated with an $(n-1)^{th}$ iteration are provided to the duty cycle adjuster 108.

A third bit value of the third correction bit B3 may be associated with the logic state of the duty cycle detection signal DS, and a fourth bit value of the fourth correction bit B4 may be associated with a complementary of the logic state of the duty cycle detection signal DS. For example, when the duty cycle detection signal DS is at a logic high state, the third bit value may be a logic '1' and the fourth bit value may be a logic '0'. The third and fourth bit values remain unchanged during the duty cycle adjustment. Based on the received first and second sets of bit values and the third and fourth bit values, the duty cycle adjuster 108 generates the first and second differential output signals O1 and O2 such that the difference between the third and fourth duty cycles is less than the predefined threshold value (i.e., the third and fourth duty cycles are within the predefined range of the reference duty cycle).

The correction bit generator 118 is further configured to generate the first and second control signals CS1 and CS2 based on the reset signal RST and the lock signal LOCK. The correction bit generator 118 is further configured to provide the first and second control signals CS1 and CS2 to the duty cycle detector 110 and the clock generator 114, respectively. In an embodiment, when the reset signal RST is at a logic high state and the lock signal LOCK is at a logic low state, the first and second control signals CS1 and CS2 are generated at logic high and logic low states, respectively. When the reset signal RST is at a logic low state and/or the lock signal LOCK is at a logic high state, the first and second control signals CS1 and CS2 are generated at logic low and logic high states, respectively.

In operation, the duty cycle correction circuit 106 (i.e., the duty cycle adjuster 108) receives the first and second differential input signals D1 and D2 having the distorted duty cycles (i.e., the first and second duty cycles). Further, the correction bit generator 118 receives the reset signal RST at a logic high state, thereby activating the correction bit generator 118. The correction bit generator 118 thus generates the first and second control signals CS1 and CS2 at logic high and logic low states, respectively. As the first and second control signals CS1 and CS2 are at logic high and logic low states, the duty cycle detector 110 and the clock generator 114 are activated, respectively. The clock generator 114 generates and provides the first through fourth clock signals CLK1-CLK4 to the duty cycle detector 110. The clock generator 114 further generates the first intermediate clock signal F1 at a logic low state for activating the lock signal generator 116. The correction bit generator 118 further generates the first and second sets of correction bits B1[N:0] and B2[N:0] at logic low and logic high states, respectively, (i.e., each bit value of the first set of bit values is a logic '0' and each bit value of the second set of bit values is a logic '1'). The correction bit generator 118 may further generate the third and fourth correction bits B3 and B4 at logic high and logic low states, respectively (i.e., the third and fourth bit values are logic '1' and logic '0', respectively) or at logic low and logic high states, respectively (i.e., the third and fourth bit values are logic '0' and logic '1', respectively).

During a first iteration of the duty cycle adjustment, the duty cycle adjuster 108 outputs the first and second differential output signals O1 and O2 having the third and fourth duty cycles that are equal to the first and second duty cycles, respectively. For the sake of brevity, it is assumed that the third duty cycle is greater than the fourth duty cycle. In an example, the first and second duty cycles are 52% and 48%, respectively, and the precision is 0.4%. Thus, during the first iteration, the third and fourth duty cycles are 52% and 48%, respectively. The duty cycle detector 110 thus generates and provides the duty cycle detection signal DS at a logic high state to the lock signal generator 116 and the correction bit generator 118. The first and second sets of bit values are unchanged after the first iteration. Further, as the duty cycle detection signal DS is at a logic high state, the third and fourth correction bits B3 and B4 are at logic high and logic low states, respectively.

During a second iteration of the duty cycle adjustment, the third and fourth duty cycles remain unchanged (i.e., the third and fourth duty cycles are equal to the first and second duty cycles, respectively). In the example, during the second iteration, the third and fourth duty cycles are 52% and 48%, respectively. The duty cycle detection signal DS thus remains at a logic high state. As the logic state of the duty cycle detection signal DS during the second iteration is same as that during the first iteration, the lock signal LOCK is generated at a logic low state. As the lock signal LOCK is at a logic low state, the correction bit generator 118 generates the first and second sets of bit values based on the thermometric code. In other words, a first correction bit B1[0] of the first set of correction bits B1[N:0] and a second correction bit B2[0] of the second set of correction bits B2[N:0] are at logic high and logic low states, respectively, and the remaining correction bits of the first and second sets of correction bits B1[N:0] and B2[N:0] are unchanged. Further, the third and fourth correction bits B3 and B4 are at logic high and logic low states, respectively.

During a third iteration of the duty cycle adjustment, the duty cycle adjuster 108 receives the first and second sets of correction bits B1[N:0] and B2[N:0] generated by the correction bit generator 118 during the second iteration. Based on the received first and second sets of correction bits B1[N:0] and B2[N:0], the duty cycle adjuster 108 outputs the first differential output signal O1 having the third duty cycle that is less than the first duty cycle, and the second differential output signal O2 having the fourth duty cycle that is greater than the second duty cycle. The difference between the third and fourth duty cycles thus reduces as compared to the difference between the third and fourth duty cycles in the first and second iterations. In the example, during the third iteration, the third duty cycle is decreased by 0.4% and the fourth duty cycle is increased by 0.4%. Thus, the third and fourth duty cycles are 51.6% and 48.4%, respectively. The third duty cycle, however, remains greater than the fourth duty cycle during the third iteration. Hence, the duty cycle detection signal DS and the lock signal LOCK remain at logic high and logic low states, respectively. As a result, the third and fourth correction bits B3 and B4 remain at logic high and logic low states, respectively, and the correction bit generator 118 adjusts the first and second sets of bit values based on the thermometric code. In other words, the first correction bit B1[0] and a fifth correction bit B1[1] of the first set of correction bits B1[N:0] are at logic high states, the second correction bit B2[0] and a sixth correction bit B2[1] of the second set of correction bits B2[N:0] are at logic low states, and the remaining correction bits of the first and second sets of correction bits B1[N:0] and B2[N:0] are unchanged. Thus, the number of bits of the first and second sets of correction bits B1[N:0] and B2[N:0] that are activated and deactivated, respectively, increases.

During a fourth iteration of the duty cycle adjustment, the duty cycle adjuster 108 receives the first and second sets of correction bits B1[N:0] and B2[N:0] generated by the correction bit generator 118 during the third iteration. Based on the received first and second sets of correction bits B1[N:0] and B2[N:0], the duty cycle adjuster 108 outputs the first differential output signal O1 having the third duty cycle that is further less than the first duty cycle, and the second differential output signal O2 having the fourth duty cycle that is further greater than the second duty cycle, as compared to the third and fourth duty cycles of the third iteration. The difference between the third and fourth duty cycles thus reduces further as compared to the difference between the third and fourth duty cycles in the first through third iterations. In the example, during the fourth iteration, the third duty cycle of the third iteration is decreased by 0.4% and the fourth duty cycle of the third iteration is increased by 0.4%. Thus, the third and fourth duty cycles are 51.2% and 48.8%, respectively. The third duty cycle, however, remains greater than the fourth duty cycle during the fourth iteration. Hence, the duty cycle detection signal DS and the lock signal LOCK remain at logic high and logic low states, respectively. As a result, the third and fourth correction bits B3 and B4 remain at logic high and logic low states, respectively, and the correction bit generator 118 adjusts the first and second sets of bit values based on the thermometric code. Thus, the first and fifth correction bits B1[0] and B1[1] and a seventh correction bit B1[2] of the first set of correction bits B1[N:0] are at logic high states, the second and sixth correction bits B2[0] and B2[1] and an eighth correction bit B2[2] of the second set of correction bits B2[N:0] are at logic low states, and the remaining correction bits of the first and second sets of correction bits B1[N:0] and B2[N:0] are unchanged. As a result, the number of bits of the first and second sets of correction bits B1[N:0] and B2[N:0] that are activated and deactivated, respectively, further increases.

During each subsequent iteration, the difference between the third and fourth duty cycles further reduces, and the adjustment of the first and second duty cycles continues until the third duty cycle is less than the fourth duty cycle. For the sake of ongoing discussion, it is assumed that the third duty cycle is less than the fourth duty cycle during the $n^{th}$ iteration. The duty cycle detector 110 thus generates the duty cycle detection signal DS at a logic low state. In other words, the duty cycle detection signal DS toggles from a logic high state to a logic low state. The lock signal LOCK thus toggles from a logic low state to a logic high state. As the lock signal LOCK is activated, the correction bit generator 118 provides the first and second sets of bit values corresponding to the $(n-1)^{th}$ iteration to the duty cycle adjuster 108. Based on the first and second sets of bit values corresponding to an $(n-1)^{th}$ iteration and the third and fourth bit values, the duty cycle adjuster 108 outputs the first and second differential output signals O1 and O2 such that the third and fourth duty cycles are within the predefined range of the reference duty cycle. In the example, the third and fourth duty cycles are further decreased and increased by 0.4%, respectively, during each subsequent iteration. Thus, during fifth through seventh iterations, the third duty cycle is 50.8%, 50.4%, and 50%, respectively, and the fourth duty cycle is 49.2%, 49.6%, and 50%, respectively. During an eighth iteration, the third and fourth duty cycles are 49.6% and 50.4%, respectively. Thus, the eighth iteration corresponds to the $n^{th}$ iteration. Hence, the first and second sets of bit values of the first and second sets of correction bits B1[N:0] and B2[N:0], and the third and fourth bit values of the third and fourth correction bits B3 and B4 associated with the seventh iteration (i.e., the $(n-1)^{th}$ iteration) is provided to the duty cycle adjuster 108 for generating the first and second differential output signals O1 and O2 having 50% duty cycles.

The first and second control signals CS1 and CS2 toggle from logic high and logic low states to logic low and logic high states, respectively, thereby deactivating the duty cycle detector 110 and the clock generator 114. The deactivation of the clock generator 114 results in the deactivation of the lock signal generator 116. The deactivation of the duty cycle detector 110, the clock generator 114, and the lock signal generator 116 ensures that the duty cycle correction circuit 106 is non-operational when the duty cycle correction is inessential.

It will be apparent to a person skilled in the art that when the third duty cycle is less than the fourth duty cycle, the operations performed for correcting the duty cycle distortion are similar to the operations performed when the third duty cycle is greater than the fourth duty cycle. In such a scenario, the third duty cycle is increased with each iteration, and the fourth duty cycle is decreased with each iteration until the duty cycle detection signal DS toggles from a logic low state to a logic high state (i.e., until the third duty cycle is greater than the fourth duty cycle).

Although the SoC 100 corresponds to a SerDes, the present disclosure is not limited to it. It will be understood by a person skilled in the art that the SoC 100 may correspond to various other devices that require duty cycle correction, without deviating from the scope of the present disclosure.

Figure 2:
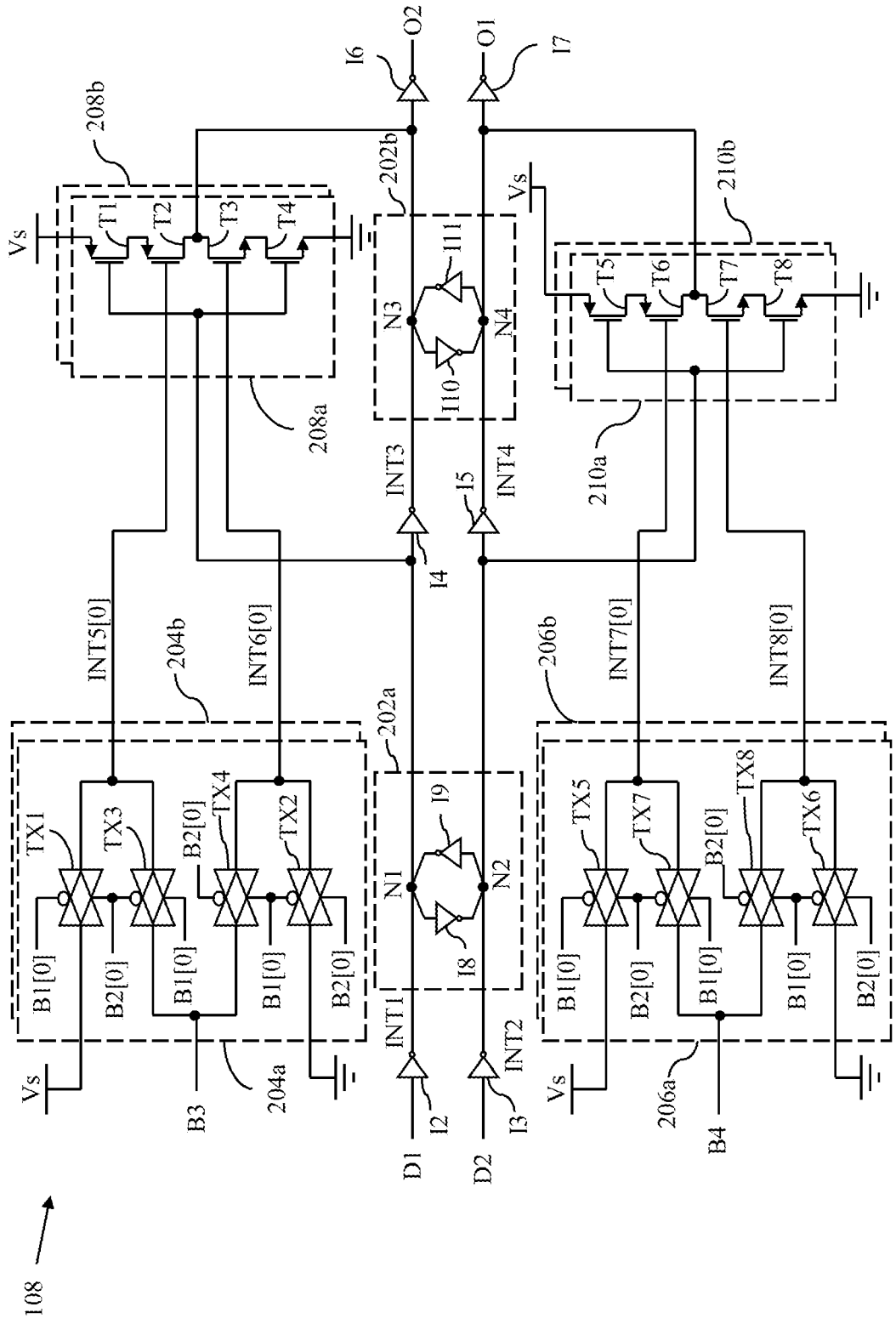
FIG. 2 is a schematic circuit diagram of a duty cycle adjuster of the SoC of FIG. 1 in accordance with an embodiment of the present disclosure.

Referring now to FIG. 2, a schematic circuit diagram of the duty cycle adjuster 108 in accordance with an embodiment of the present disclosure is shown. The duty cycle adjuster 108 includes second through seventh inverters I2-I7 and first and second pairs of back-to-back inverters 202a and 202b. The duty cycle adjuster 108 further includes a first set of transmission gate arrays of which first and second transmission gate arrays 204a and 204b are shown, a second set of transmission gate arrays of which third and fourth transmission gate arrays 206a and 206b are shown, a first set of tristate inverters of which first and second tristate inverters 208a and 208b are shown, and a second set of tristate inverters of which third and fourth tristate inverters 210a and 210b are shown.

The second and third inverters I2 and I3 have input terminals that are coupled with the set of buffers 104 and the first inverter I1, and are configured to receive the first and second differential input signals D1 and D2, respectively. Further, output terminals of the second and third inverters I2 and I3 are configured to output first and second intermediate signals INT1 and INT2 that are inverted versions of the first and second differential input signals D1 and D2, respectively. The fourth and fifth inverters I4 and I5 have input terminals that are coupled with the output terminals of the second and third inverters I2 and I3, and are configured to receive the first and second intermediate signals INT1 and INT2, respectively. The fourth and fifth inverters I4 and I5 further have output terminals that are configured to output third and fourth intermediate signals INT3 and INT4 that are inverted versions of the first and second intermediate signals INT1 and INT2, respectively. The sixth and seventh inverters I6 and I7 have input terminals that are coupled with the output terminals of the fourth and fifth inverters I4 and I5, and are configured to receive the third and fourth intermediate signals INT3 and INT4, and output terminals that are configured to output the second and first differential output signals O2 and O1, respectively.

When the first and second differential input signals D1 and D2 are at logic high and logic low states, respectively, the first and second intermediate signals INT1 and INT2 are at logic low and logic high states, respectively. Further, the third and fourth intermediate signals INT3 and INT4 are at logic high and logic low states, respectively, and the second and first differential output signals O2 and O1 are at logic low and logic high states, respectively. When the first and second differential input signals D1 and D2 are at logic low and logic high states, respectively, the first and second intermediate signals INT1 and INT2 are at logic high and logic low states, respectively. Further, the third and fourth intermediate signals INT3 and INT4 are at logic low and logic high states, respectively, and the second and first differential output signals O2 and O1 are at logic high and logic low states, respectively.

The first pair of back-to-back inverters 202a includes eighth and ninth inverters I8 and I9. An output terminal of the ninth inverter I9 and an input terminal of the eighth inverter I8 are coupled with each other at a first node N1, and an output terminal of the eighth inverter I8 and an input terminal of the ninth inverter I9 are coupled with each other at a second node N2. The first node N1 is further coupled with the output terminal of the second inverter I2 and the input terminal of the fourth inverter I4, and the second node N2 is further coupled with the output terminal of the third inverter I3 and the input terminal of the fifth inverter I5. The first pair of back-to-back inverters 202a maintain the logic states of the first and second intermediate signals INT1 and INT2, thereby maintaining a skew between the first and second intermediate signals INT1 and INT2 and assisting in duty cycle adjustment of the first and second duty cycles.

The second pair of back-to-back inverters 202b includes tenth and eleventh inverters I10 and I11. An output terminal of the eleventh inverter I11 and an input terminal of the tenth inverter I10 are coupled with each other at a third node N3, and an output terminal of the tenth inverter I10 and an input terminal of the eleventh inverter I11 are coupled with each other at a fourth node N4. The third node N3 is further coupled with the output terminal of the fourth inverter I4 and the input terminal of the sixth inverter I6, and the fourth node N4 is further coupled with the output terminal of the fifth inverter I5 and the input terminal of the seventh inverter I7. The second pair of back-to-back inverters 202b maintain the logic states of the third and fourth intermediate signals INT3 and INT4, thereby maintaining a skew between the third and fourth intermediate signals INT3 and INT4 and assisting in duty cycle adjustment of the first and second duty cycles.

The first set of transmission gate arrays is coupled with the correction bit generator 118, and is configured to receive the first and second sets of correction bits B1[N:0] and B2[N:0], respectively. The first set of transmission gate arrays is further configured to receive the third correction bit B3 and a supply voltage Vs. Based on the first and second sets of correction bits B1[N:0] and B2[N:0], the third correction bit B3, and the supply voltage Vs, the first set of transmission gate arrays is further configured to generate a fifth set of intermediate signals INT5[N:0] and a sixth set of intermediate signals INT6[N:0], respectively. Similarly, the second set of transmission gate arrays is coupled with the correction bit generator 118, and is configured to receive the first and second sets of correction bits B1[N:0] and B2[N:0], respectively. The second set of transmission gate arrays is further configured to receive the fourth correction bit B4 and the supply voltage Vs. Based on the first and second sets of correction bits B1[N:0] and B2[N:0], the fourth correction bit B4, and the supply voltage Vs, the second set of transmission gate arrays is further configured to generate a seventh set of intermediate signals INT7[N:0] and an eighth set of intermediate signals INT8[N:0], respectively.

The first transmission gate array 204a includes first through fourth transmission gates TX1-TX4. The first and second transmission gates TX1 and TX2 have first and second control terminals that are coupled with the correction bit generator 118, and are configured to receive the first and second correction bits B1[0] and B2[0], respectively. In one embodiment, the first and second control terminals are negative and positive control terminals of the first and second transmission gates TX1 and TX2, respectively. Further, a first data terminal of the first transmission gate TX1 is configured to receive the supply voltage Vs, and a first data terminal of the second transmission gate TX2 is coupled with ground.

The third and fourth transmission gates TX3 and TX4 have first and second control terminals that are coupled with the correction bit generator 118, and are configured to receive the second and first correction bits B2[0] and B1[0], respectively. In one embodiment, the first and second control terminals are negative and positive control terminals of the third and fourth transmission gates TX3 and TX4, respectively. Further, first data terminals of the third and fourth transmission gates TX3 and TX4 are coupled with the correction bit generator 118, and are configured to receive the third correction bit B3. The third and fourth transmission gates TX3 and TX4 further have second data terminals that are coupled with second data terminals of the first and second transmission gates TX1 and TX2. The second data terminals of the third and fourth transmission gates TX3 and TX4 are configured to output fifth and sixth intermediate signals INT5[0] and INT6[0] of the fifth and sixth sets of intermediate signals INT5[N:0] and INT6[N:0], respectively.

The third transmission gate array 206a includes fifth through eighth transmission gates TX5-TX8. The fifth and sixth transmission gates TX5 and TX6 have first and second control terminals that are configured to receive the first and second correction bits B1[0] and B2[0], respectively. In one embodiment, the first and second control terminals are negative and positive control terminals of the fifth and sixth transmission gates TX5 and TX6, respectively. Further, a first data terminal of the fifth transmission gate TX5 is configured to receive the supply voltage Vs, and a first data terminal of the sixth transmission gate TX6 is coupled with ground.

The seventh and eighth transmission gates TX7 and TX8 have first and second control terminals that are coupled with the correction bit generator 118, and are configured to receive the second and first correction bits B2[0] and B1[0], respectively. In one embodiment, the first and second control terminals are negative and positive control terminals of the seventh and eighth transmission gates TX7 and TX8, respectively. Further, first data terminals of the seventh and eighth transmission gates TX7 and TX8 are coupled with the correction bit generator 118, and are configured to receive the fourth correction bit B4. The seventh and eighth transmission gates TX7 and TX8 further have second data terminals coupled with second data terminals of the fifth and sixth transmission gates TX5 and TX6. The second data terminals of the seventh and eighth transmission gates TX7 and TX8 are configured to output seventh and eighth intermediate signals INT7[0] and INT8[0] of the seventh and eighth sets of intermediate signals INT7[N:0] and INT8[N:0], respectively. In the presently preferred embodiment, the second and fourth transmission gate arrays 204b and 206b are structurally and functionally similar to the first and third transmission gate arrays 204a and 206a.

The first set of tristate inverters is coupled with the first set of transmission gate arrays and the output terminal of the second inverter I2. The first set of tristate inverters is further configured to receive the fifth and sixth sets of intermediate signals INT5[N:0] and INT6[N:0], the supply voltage Vs, and the first intermediate signal INT1. Further, the first set of tristate inverters is further coupled with the third node N3 for controlling a rise time and a fall time of the third intermediate signal INT3. Similarly, the second set of tristate inverters is coupled with the second set of transmission gate arrays and the output terminal of the third inverter I3. Further, the second set of tristate inverters is configured to receive the supply voltage Vs, the seventh and eighth sets of intermediate signals INT7[N:0] and INT8[N:0], and the second intermediate signal INT2. The second set of tristate inverters is further coupled with the fourth node N4 for controlling a rise time and a fall time of the fourth intermediate signal INT4.

The first tristate inverter 208a includes first through fourth transistors T1-T4. The first transistor T1 has a source terminal that receives the supply voltage Vs, and a gate terminal coupled with the output terminal of the second inverter I2 for receiving the first intermediate signal INT1. The second transistor T2 has a source terminal coupled with a drain terminal of the first transistor T1, and a gate terminal coupled with the second data terminal of the first transmission gate TX1 for receiving the fifth intermediate signal INT5[0]. The third transistor T3 has a drain terminal coupled with a drain terminal of the second transistor T2, and a gate terminal coupled with the second data terminal of the second transmission gate TX2 for receiving the sixth intermediate signal INT6[0]. The fourth transistor T4 has a drain terminal coupled with a source terminal of the third transistor T3, a gate terminal coupled with the gate terminal of the first transistor T1, and a source terminal coupled with ground. The drain terminals of the second and third transistors T2 and T3 are further coupled with the third node N3 for controlling the rise time and the fall time of the third intermediate signal INT3, thereby controlling the fourth duty cycle of the second differential output signal O2. In an embodiment, the first and second transistors T1 and T2 are PMOS transistors and the third and fourth transistors T3 and T4 are NMOS transistors. It will be apparent to a person skilled in the art that the second tristate inverter 208b is structurally and functionally similar to the first tristate inverter 208a.

The third tristate inverter 210a includes fifth through eighth transistors T5-T8. The fifth transistor T5 has a source terminal that receives the supply voltage Vs, and a gate terminal coupled with the output terminal of the third inverter I3 for receiving the second intermediate signal INT2. The sixth transistor T6 has a source terminal coupled with a drain terminal of the fifth transistor T5, and a gate terminal coupled with the second data terminal of the fifth transmission gate TX5 for receiving the seventh intermediate signal INT7[0]. The seventh transistor T7 has a drain terminal coupled with a drain terminal of the sixth transistor T6, and a gate terminal coupled with the second data terminal of the sixth transmission gate TX6 for receiving the eighth intermediate signal INT8[0]. The eighth transistor T8 has a drain terminal coupled with a source terminal of the seventh transistor T7, a gate terminal coupled with the gate terminal of the fifth transistor T5, and a source terminal coupled with ground. The drain terminals of the sixth and seventh transistors T6 and T7 are further coupled with the fourth node N4 for controlling the rise time and the fall time of the fourth intermediate signal INT4, thereby controlling the third duty cycle of the first differential output signal O1. In an embodiment, the fifth and sixth transistors T5 and T6 are PMOS transistors and the seventh and eighth transistors T7 and T8 are NMOS transistors. It will be apparent to a person skilled in the art that the fourth tristate inverter 210b is structurally and functionally similar to the third tristate inverter 210a.

During the first iteration of the duty cycle adjustment, the first and second correction bits B1[0] and B2[0] are at logic low and logic high states, respectively. Thus, the first, second, fifth, and sixth transmission gates TX1, TX2, TX5, and TX6 are activated and the third, fourth, seventh, and eighth transmission gates TX3, TX4, TX7, and TX8 are deactivated. As a result, the gate terminals of the second and sixth transistors T2 and T6 receive the supply voltage Vs and the gate terminals of the third and seventh transistors T3 and T7 are coupled with ground. Thus, the first and third tristate inverters 208a and 210a are non-operational. Similarly, the remaining correction bits of the first set of correction bits B1[N:0] are at logic low states and the remaining correction bits of the second set of correction bits B2[N:0] are at logic high states. Hence, the first and second sets of tristate inverters are non-operational. Thus, the first and second differential output signals O1 and O2 are generated such that the third and fourth duty cycles are equal to the first and second duty cycles, respectively. For the sake of ongoing discussion, it is assumed that the third duty cycle is greater than the fourth duty cycle. The functionality of the duty cycle adjuster 108 during the second iteration of the duty cycle adjustment is same as that during the first iteration of the duty cycle adjustment.

During the third iteration of the duty cycle adjustment, the third and fourth correction bits B3 and B4 are at logic high and logic low states, respectively, the first and second correction bits B1[0] and B2[0] are at logic high and logic low states, respectively, and the remaining correction bits of the first and second sets of correction bits B1[N:0] and B2[N:0] are unchanged. Thus, the third, fourth, seventh and eighth transmission gates TX3, TX4, TX7, and TX8 are activated, and the first, second, fifth, and sixth transmission gates TX1, TX2, TX5, and TX6 are deactivated. As a result, the gate terminals of the second and third transistors T2 and T3 receive the third correction bit B3 that is at a logic high state, and the gate terminals of the sixth and seventh transistors T6 and T7 receive the fourth correction bit B4 that is at a logic low state. Hence, the second and seventh transistors T2 and T7 are deactivated and the third and sixth transistors T3 and T6 are activated.

When the first intermediate signal INT1 is at a logic low state, the fourth transistor T4 is deactivated. Hence, a first parasitic capacitor (not shown) associated with the input terminal of the sixth inverter I6 is charged by way of the fourth inverter I4. When the first intermediate signal INT1 is at a logic high state, the fourth transistor T4 is activated. Thus, the charge stored in the first parasitic capacitor is discharged by way of the third and fourth transistors T3 and T4 and the fourth inverter I4, thereby increasing the rise time of the third intermediate signal INT3. The increase in the rise time of the third intermediate signal INT3 results in an increase in the fall time of the second differential output signal O2, thereby increasing the fourth duty cycle.

When the second intermediate signal INT2 is at a logic high state, the fifth transistor T5 is deactivated. Hence, a second parasitic capacitor (not shown) associated with the input terminal of the seventh inverter I7 is discharged by way of the fifth inverter I5. When the second intermediate signal INT2 is at a logic low state, the fifth transistor T5 is activated. Thus, the second parasitic capacitor is charged by way of the fifth and sixth transistors T5 and T6, in addition to the fifth inverter I5, thereby increasing the fall time of the fourth intermediate signal INT4. The increase in the fall time of the fourth intermediate signal INT4 results in an increase in the rise time of the first differential output signal O1, thereby decreasing the third duty cycle.

During the fourth iteration of the duty cycle adjustment, the third and fourth correction bits B3 and B4 are at logic high and logic low states, respectively, the first and fifth correction bits B1[0] and B1[1] are at logic high states, the second and sixth correction bits B2[0] and B2[1] are at logic low states, and the remaining correction bits of the first and second sets of correction bits B1[N:0] and B2[N:0] are unchanged. As the fifth and sixth correction bits B1[1] and B2[1] are at logic high and logic low states, respectively, the second and fourth tristate inverters 208b and 210b are operational.

When the first intermediate signal INT1 is at a logic low state, the fourth transistors T4 of the first and second tristate inverters 208a and 208b are deactivated. Hence, the first parasitic capacitor is charged by way of the fourth inverter I4. When the first intermediate signal INT1 is at a logic high state, the fourth transistors T4 of the first and second tristate inverters 208a and 208b are activated. Thus, the charge stored in the first parasitic capacitor is discharged by way of the third and fourth transistors T3 and T4 of the first and second tristate inverters 208a and 208b, in addition to the fourth inverter I4, thereby further decreasing the fall time of the third intermediate signal INT3 as compared to the third iteration. Thus, during the fourth iteration, the fourth duty cycle further increases as compared to the third iteration.

When the second intermediate signal INT2 is at a logic high state, the fifth transistors T5 of the third and fourth tristate inverters 210a and 210b are deactivated. Hence, the second parasitic capacitor is discharged by way of the fifth inverter I5. When the second intermediate signal INT2 is at a logic low state, the fifth transistors T5 of the third and fourth tristate inverters 210a and 210b are activated. Thus, the second parasitic capacitor is charged by way of the fifth and sixth transistors T5 and T6 of the third and fourth tristate inverters 210a and 210b, in addition to the fifth inverter I5, thereby further decreasing the rise time of the fourth intermediate signal INT4 as compared to the third iteration. Thus, during the fourth iteration, the third duty cycle further decreases as compared to the third iteration.

With each subsequent iteration, the number of transistors aiding the discharging of the first parasitic capacitor and charging of the second parasitic capacitor increases. Thus, with each subsequent iteration, the difference between the third and fourth duty cycles decreases. The iterations of the duty cycle adjustment continue until the third duty cycle is less than the fourth duty cycle. For the sake of ongoing discussion, it is assumed that the third duty cycle is less than the fourth duty cycle during the $n^{th}$ iteration. The first and second sets of bit values of the first and second sets of correction bits B1[N:0] and B2[N:0] of the $(n-1)^{th}$ iteration are selected, in addition to the third and fourth bit values of the third and fourth correction bits B3 and B4, for configuring the first and second sets of transmission gate arrays. This ensures that the duty cycle adjuster 108 generates the first and second differential output signals O1 and O2 having the third and fourth duty cycles that are within the predefined range of the reference duty cycle.

Although the present disclosure describes that the duty cycle adjustment is initiated during the third iteration of the duty cycle adjustment, the scope of the present disclosure is not limited to it. In various other embodiments, the duty cycle adjustment may be initiated during any iteration after the third iteration, without deviating from the scope of the disclosure.

Driving strengths of the fourth and fifth inverters I4 and I5 control the precision of the duty cycle correction circuit 106. In an embodiment, the precision increases (i.e., an amount of duty cycle adjustment during each iteration decreases) with an increase in the driving strengths of the fourth and fifth inverters I4 and I5. The precision is further determined based on a difference between the driving strength of the fourth inverter I4 and driving strengths of the first and second tristate inverters 208a and 208b, and a difference between the driving strength of the fifth inverter I5 and driving strengths of the third and fourth tristate inverters 210a and 210b. In an embodiment, the precision is greater when the driving strength of the fourth inverter I4 is greater than the driving strengths of the first and second tristate inverters 208a and 208b, as compared to when the driving strength of the fourth inverter I4 is less than the driving strengths of the first and second tristate inverters 208a and 208b. Similarly, the precision is greater when the driving strength of the fifth inverter I5 is greater than the driving strengths of the third and fourth tristate inverters 210a and 210b, as compared to when the driving strength of the fifth inverter I5 is less than the driving strengths of the third and fourth tristate inverters 210a and 210b.

The driving strengths of the fourth and fifth inverters I4 and I5 and driving strengths of sixth and seventh inverters I6 and I7 control a correction range of the duty cycle correction circuit 106. The correction range corresponds to a maximum difference between the reference duty cycle and the first and second duty cycles that is accurately corrected by the duty cycle correction circuit 106. The correction range increases with an increase in the difference between the driving strengths of the fourth and sixth inverters I4 and I6, and an increase in the difference between the driving strengths of the fifth and seventh inverters I5 and I7.

Figure 3:
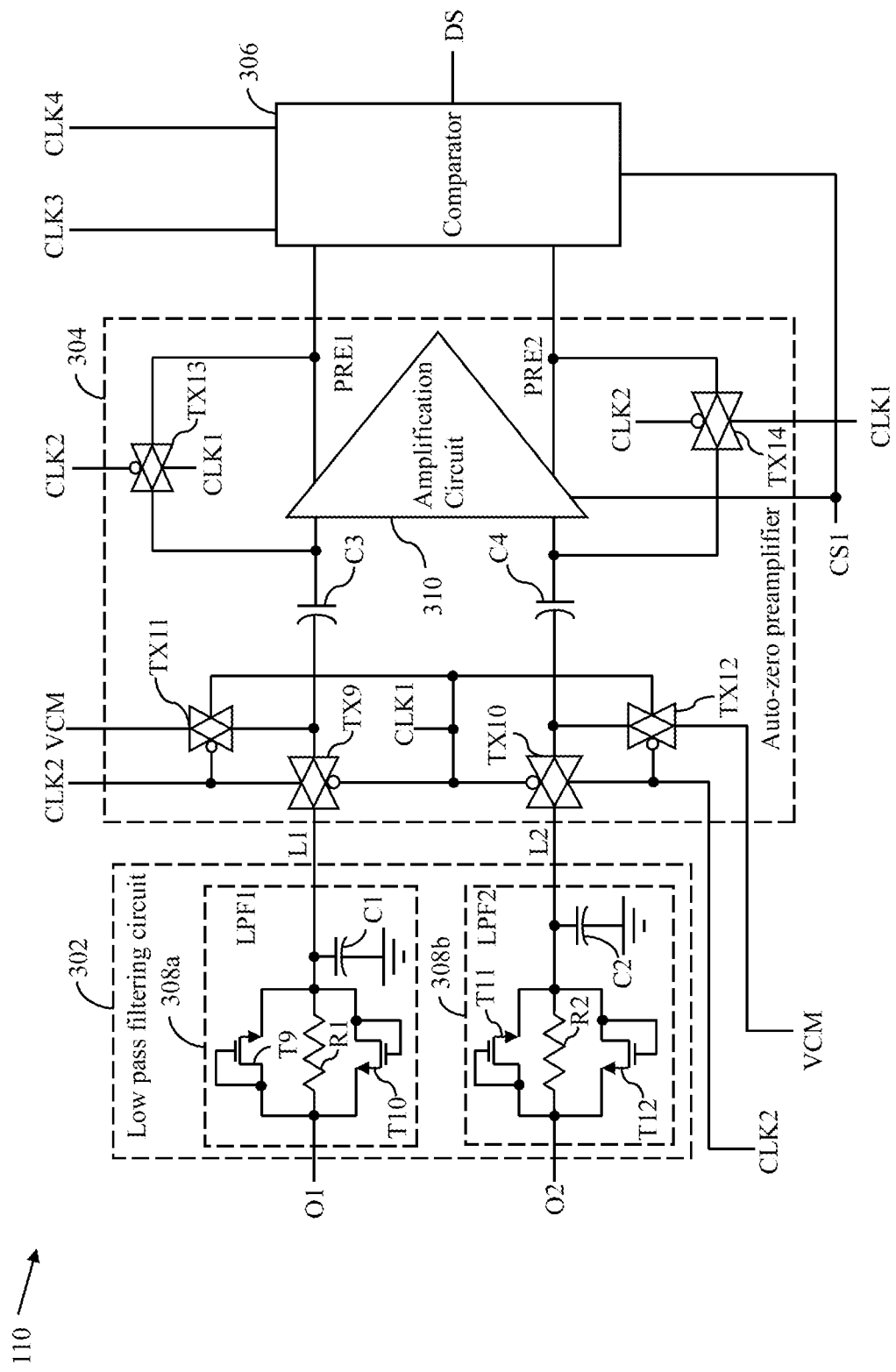
FIG. 3 is a schematic circuit diagram of a duty cycle detector of the SoC of FIG. 1 in accordance with an embodiment of the present disclosure.

Referring now to FIG. 3, a schematic circuit diagram of the duty cycle detector 110 in accordance with an embodiment of the present disclosure is shown. The duty cycle detector 110 includes a low pass filtering circuit 302, an auto-zero preamplifier 304, and a comparator 306. In an embodiment, the comparator 306 is an Armstrong comparator.

The low pass filtering circuit 302 is coupled with the duty cycle adjuster 108, and is configured to receive the first and second differential output signals O1 and O2. The low pass filtering circuit 302 is further configured to output first and second low pass filter (LPF) output signals L1 and L2. The first and second LPF output signals L1 and L2 are direct current (DC) voltages. In an embodiment, when the third duty cycle is greater than the fourth duty cycle, the first LPF output signal L1 is at a higher voltage level than the second LPF output signal L2, and when the third duty cycle is less than the fourth duty cycle, the first LPF output signal L1 is at a lower voltage level than the second LPF output signal L2. Further, it will be apparent to a person skilled in the art that when the inputs to the low pass filtering circuit 302 are signals having the reference duty cycles, the outputs of the low pass filtering circuit 302 are at a voltage level that is half of the supply voltage Vs. Thus, as the difference between the third and fourth duty cycles reduces during each iteration of the duty cycle adjustment, the voltage levels of the first and second LPF output signals L1 and L2 approaches a voltage level that is half of the supply voltage Vs.

The low pass filtering circuit 302 includes a first LPF (LPF1) 308a and a second LPF (LPF2) 308b. The LPF1 308a includes a first resistor R1, ninth and tenth transistors T9 and T10, and a first capacitor C1. The LPF2 308b includes a second resistor R2, eleventh and twelfth transistors T11 and T12, and a second capacitor C2. In an embodiment, the ninth through twelfth transistors T9-T12 are NMOS transistors.

The first resistor R1 has a first terminal that is coupled with the duty cycle adjuster 108 (i.e., the output terminal of the seventh inverter I7), and is configured to receive the first differential output signal O1. The first resistor R1 further has a second terminal that is configured to output the first LPF output signal L1. The ninth transistor T9 has first and second terminals that are coupled with the first and second terminals of the first resistor R1, respectively, and a gate terminal coupled with the first terminal of the first resistor R1. In an embodiment, the first and second terminals are drain and source terminals, respectively. The ninth transistor T9 is activated when a difference between the voltage levels of the first differential output signal O1 and the first LPF output signal L1 is greater than a threshold voltage of the ninth transistor T9. Similarly, the tenth transistor T10 has first and second terminals that are coupled with the second and first terminals of the first resistor R1, respectively, and a gate terminal coupled with the second terminal of the first resistor R1. In an embodiment, the first and second terminals are drain and source terminals, respectively. The tenth transistor T10 is activated when a difference between the voltage levels of the first LPF output signal L1 and the first differential output signal O1 is greater than a threshold voltage of the tenth transistor T10. The first capacitor C1 has a first terminal that is coupled with the second terminal of the first resistor R1, and a second terminal coupled with ground.

When the ninth transistor T9 is activated, the first capacitor C1 is charged by way of the ninth transistor T9, as a resistance associated with the ninth transistor T9 is less than a resistance of the first resistor R1. Similarly, when the tenth transistor T10 is activated, the first capacitor C1 is discharged by way of the tenth transistor T10, as a resistance associated with the tenth transistor T10 is less than the resistance of the first resistor R1. This reduces charging and discharging time of the first capacitor C1, and the settling time of the LPF1 308a (and thereby the settling time of the first LPF output signal L1) as compared to when the first capacitor C1 is charged and discharged by way of the first resistor R1.

The second resistor R2 has a first terminal that is coupled with the duty cycle adjuster 108 (i.e., the output terminal of the sixth inverter I6), and is configured to receive the second differential output signal O2. The second resistor R2 further has a second terminal that is configured to output the second LPF output signal L2. The eleventh transistor T11 has first and second terminals that are coupled with the first and second terminals of the second resistor R2, respectively, and a gate terminal coupled with the first terminal of the second resistor R2. In an embodiment, the first and second terminals are drain and source terminals, respectively. The eleventh transistor T11 is activated when a difference between the voltage levels of the second differential output signal O2 and the second LPF output signal L2 is greater than a threshold voltage of the eleventh transistor T11. The twelfth transistor T12 has first and second terminals that are coupled with the second and first terminals of the second resistor R2, respectively, and a gate terminal coupled with the second terminal of the second resistor R2. In an embodiment, the first and second terminals are drain and source terminals, respectively. The twelfth transistor T12 is activated when a difference between the voltage levels of the second LPF output signal L2 and the second differential output signal O2 is greater than a threshold voltage of the twelfth transistor T12. The second capacitor C2 has a first terminal that is coupled with the second terminal of the second resistor R2, and a second terminal coupled with ground. Similar to the charging and discharging of the first capacitor C1, the second capacitor C2 is charged and discharged by way of the eleventh and twelfth transistors T11 and T12, when the eleventh and twelfth transistors T11 and T12 are activated, respectively.

The auto-zero preamplifier 304 is coupled with the low pass filtering circuit 302 (i.e., the first and second resistors R1 and R2), and the clock generator 114. The auto-zero preamplifier 304 is configured to receive the first and second LPF output signals L1 and L2 and the first and second clock signals CLK1 and CLK2. Further, the auto-zero preamplifier 304 is further configured to amplify, based on the first and second clock signals CLK1 and CLK2, the first and second LPF output signals L1 and L2 to generate first and second preamplifier output signals PRE1 and PRE2, respectively. In other words, the auto-zero preamplifier 304 amplifies the difference between the third and fourth duty cycles to facilitate accurate detection of whether the third duty cycle is greater than the fourth duty cycle or whether the fourth duty cycle is greater than the third duty cycle. The auto-zero preamplifier 304 includes ninth through fourteenth transmission gates TX9-TX14, third and fourth capacitors C3 and C4, and an amplification circuit 310.

The ninth and tenth transmission gates TX9 and TX10 have first data terminals that are coupled with the low pass filtering circuit 302 (i.e., the second terminals of the first and second resistors R1 and R2, respectively), and are configured to receive the first and second LPF output signals L1 and L2, respectively. The ninth and tenth transmission gates TX9 and TX10 further have first and second control terminals that are coupled with the clock generator 114, and are configured to receive the first and second clock signals CLK1 and CLK2, respectively. In an embodiment, the first and second control terminals are negative and positive control terminals of the ninth and tenth transmission gates TX9 and TX10, respectively. When the first clock signal CLK1 is at a logic high state and the second clock signal CLK2 is at a logic low state (i.e., during a positive half cycle of the first clock signal CLK1 and a negative half cycle of the second clock signal CLK2, respectively), the ninth and tenth transmission gates TX9 and TX10 are deactivated. Further, when the first clock signal CLK1 is at a logic low state and the second clock signal CLK2 is at a logic high state, the ninth and tenth transmission gates TX9 and TX10 are activated. When the ninth and tenth transmission gates TX9 and TX10 are activated, second data terminals of the ninth and tenth transmission gates TX9 and TX10 output the first and second LPF output signals L1 and L2, respectively.

The eleventh and twelfth transmission gates TX11 and TX12 have first and second control terminals that are coupled with the clock generator 114, and are configured to receive the second and first clock signals CLK2 and CLK1, respectively, and first data terminals that are configured to receive a reference voltage signal VCM. The eleventh and twelfth transmission gates TX11 and TX12 further have second data terminals coupled with the second data terminals of the ninth and tenth transmission gates, respectively. In an embodiment, the first and second control terminals are negative and positive control terminals of the eleventh and twelfth transmission gates TX11 and TX12, respectively. The reference voltage signal VCM is generated based on the supply voltage Vs by a voltage divider circuit (not shown). The voltage-divider circuit may be internal or external to the SoC 100. In an example, a voltage level of the reference voltage signal VCM is half of the voltage level of the supply voltage Vs. When the first clock signal CLK1 is at a logic high state and the second clock signal CLK2 is at a logic low state, the eleventh and twelfth transmission gates TX11 and TX12 are activated. Further, when the first clock signal CLK1 is at a logic low state and the second clock signal CLK2 is at a logic high state, the eleventh and twelfth transmission gates TX11 and TX12 are deactivated. When the eleventh and twelfth transmission gates TX11 and TX12 are activated, the second data terminals of the eleventh and twelfth transmission gates TX11 and TX12 output the reference voltage signal VCM.

The third and fourth capacitors C3 and C4 have first terminals coupled with the second data terminals of the eleventh and twelfth transmission gates TX11 and TX12, respectively.

The thirteenth and fourteenth transmission gates TX13 and TX14 have first data terminals that are coupled with second terminals of the third and fourth capacitors C3 and C4, respectively. The thirteenth and fourteenth transmission gates TX13 and TX14 further have first and second control terminals that are coupled with the clock generator 114, and are configured to receive the second and first clock signals CLK2 and CLK1, respectively. In an embodiment, the first and second control terminals are negative and positive control terminals of the thirteenth and fourteenth transmission gates TX13 and TX14, respectively. When the first clock signal CLK1 is at a logic high state and the second clock signal CLK2 is at a logic low state, the thirteenth and fourteenth transmission gates TX13 and TX14 are activated. Further, when the first clock signal CLK1 is at a logic low state and the second clock signal CLK2 is at a logic high state, the thirteenth and fourteenth transmission gates TX13 and TX14 are deactivated.

The amplification circuit 310 has first and second input terminals that are coupled with the second terminals of the third and fourth capacitors C3 and C4, respectively. The amplification circuit 310 further has first and second output terminals coupled with second data terminals of the thirteenth and fourteenth transmission gates TX13 and TX14 and the comparator 306, and are configured to output the first and second preamplifier output signals PRE1 and PRE2, respectively.

When the first clock signal CLK1 is at a logic high state and the second clock signal CLK2 is at a logic low state (i.e., during an auto-zero phase of the auto-zero preamplifier 304), each of the eleventh and twelfth transmission gates TX11 and TX12 output the reference voltage signal VCM. The amplification circuit 310 receives the reference voltage signal VCM, and outputs an offset voltage of the amplification circuit 310 (i.e., a voltage level of an error signal that is associated with the amplification circuit 310). The offset voltage of the amplification circuit 310 is then stored in the third and fourth capacitors C3 and C4 by way of the thirteenth and fourteenth transmission gates TX13 and TX14, respectively. When the first clock signal CLK1 is at a logic low state and the second clock signal CLK2 is at a logic high state (i.e., during an amplification phase of the auto-zero preamplifier 304), the ninth and tenth transmission gates TX11 and TX12 output the first and second LPF output signals L1 and L2, respectively. Further, the offset voltage is added to voltage levels of the first and second LPF output signals L1 and L2 outputted by the ninth and tenth transmission gates TX9 and TX10, respectively. When the voltage levels of the first and second LPF output signals L1 and L2 with the added offset voltage are amplified by the amplification circuit 310, the offset voltage of the amplification circuit 310 is cancelled out by the offset voltages stored in the third and fourth capacitors C3 and C4. Thus, the first and second preamplifier output signals PRE1 and PRE2 are devoid of the offset voltage of the amplification circuit 310 and correspond to amplified versions of the first and second LPF output signals L and L2, respectively. Further, the first and second preamplifier output signals PRE1 and PRE2 are generated such that a difference between voltage levels of the first and second preamplifier output signals PRE1 and PRE2 is greater than an offset voltage of the comparator 306.

The comparator 306 is coupled with the auto-zero preamplifier 304, and is configured to receive the first and second preamplifier output signals PRE1 and PRE2. The comparator 306 is further coupled with the clock generator 114, and is further configured to receive the third and fourth clock signals CLK3 and CLK4. Further, the comparator 306 is further configured to generate the duty cycle detection signal DS by comparing the first and second preamplifier output signals PRE1 and PRE2. The comparator 306 (i.e., the Armstrong comparator) is capable of accurately detecting whether the first preamplifier output signal PRE1 is greater than, equal to, or less than the second preamplifier output signal PRE2 even when a difference between the voltage levels of the first and second preamplifier output signals PRE1 and PRE2 is significantly small.

The comparator 306 generates the duty cycle detection signal DS when the fourth clock signal CLK4 is at a logic high state and the third clock signal CLK3 is at a logic low state. When the voltage level of the first preamplifier output signal PRE1 is greater than the voltage level of the second preamplifier output signal PRE2, the duty cycle detection signal DS is generated at a logic high state. Similarly, when the voltage level of the first preamplifier output signal PRE1 is less than the voltage level of the second preamplifier output signal PRE2, the duty cycle detection signal DS is generated at a logic low state.

The amplification circuit 310 and the comparator 306 is further coupled with the correction bit generator 118 for receiving the first control signal CS1. The amplification circuit 310 and the comparator 306, and hence the duty cycle detector 110, are operational when the first control signal CS1 is at a logic high state.

Although FIG. 3 describes use of a single auto-zero preamplifier (i.e., the auto-zero preamplifier 304), the scope of the present disclosure is not limited to it. In various other embodiments, a chain of auto-zero preamplifiers may be utilized to ensure that the voltage levels of the first and second preamplifier output signals PRE1 and PRE2 are greater than the offset voltage of the comparator 306.

Figure 4A:
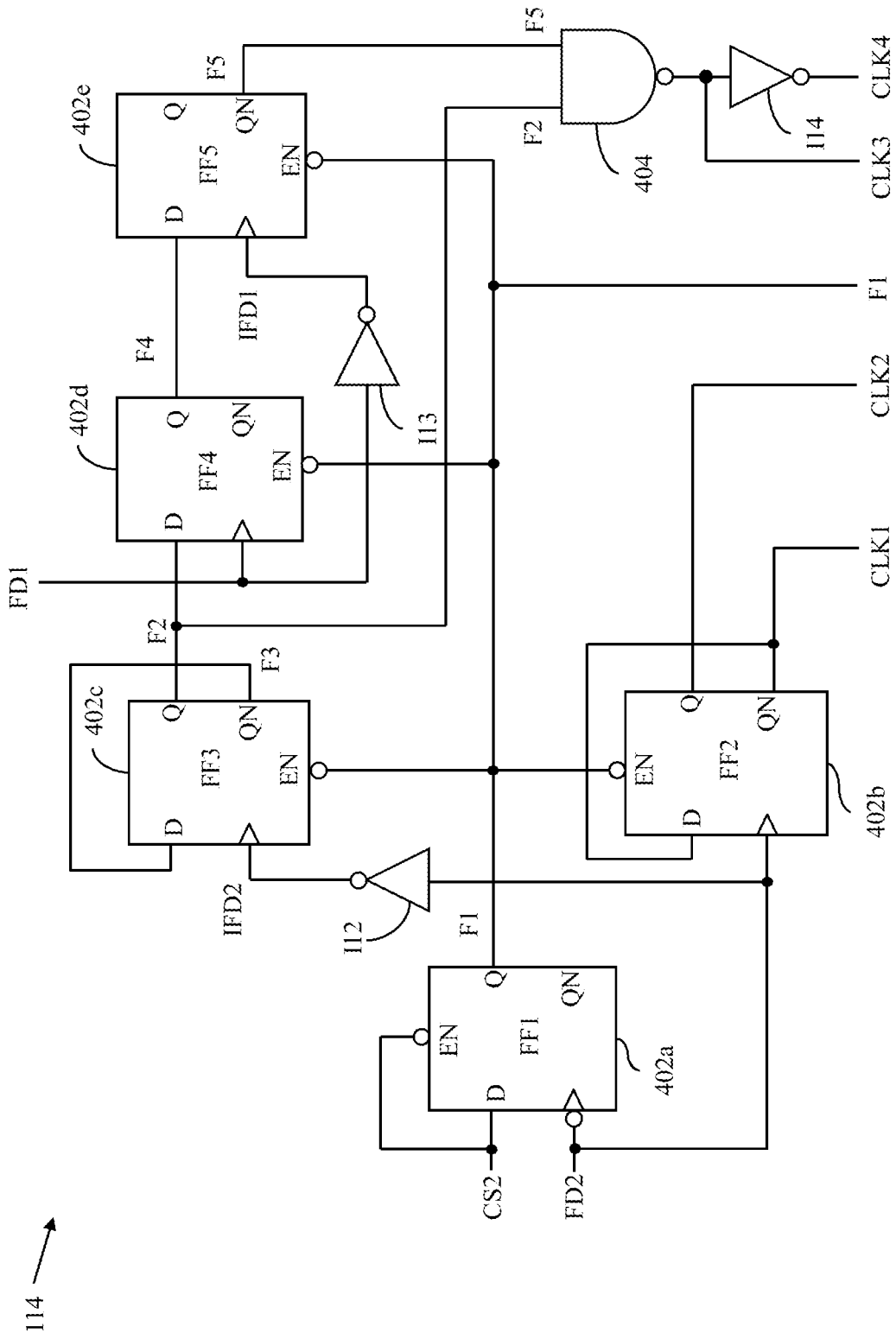
FIG. 4A is a schematic circuit diagram of a clock generator of the SoC of FIG. 1 in accordance with an embodiment of the present disclosure.

Referring now to FIG. 4A, a schematic circuit diagram of the clock generator 114 in accordance with an embodiment of the present disclosure is shown. The clock generator 114 includes first through fifth flip-flops (FF1-FF5) 402a-402e, twelfth through fourteenth inverters I12-I14, and a first logic gate 404. In an embodiment, each of the FF1-FF5 402a-402e is a D FF and the first logic gate 404 is a NAND gate.

The FF1 402a has input and control terminals that are coupled with the correction bit generator 118, and a clock terminal that is coupled with the second frequency divider circuit 112b. The input and control terminals of the FF1 402a are configured to receive the second control signal CS2, and the clock terminal of the FF1 402a is configured to receive the second frequency divided signal FD2. The FF1 402a further has an output terminal that is configured to output the first intermediate clock signal F1 (hereinafter referred to as a "first FF output signal F1"). In an embodiment, the output terminal that outputs the first FF output signal F1 is a positive output terminal of the FF1 402a. When the second control signal CS2 is at a logic low state, the FF1 402a is operational and generates, at a negative clock edge of the second frequency divided signal FD2, the first FF output signal F1 at a logic low state. When the second control signal CS2 is at a logic high state, the FF1 402a is non-operational. In such a scenario, the first FF output signal F1 may be at a logic high state.

The FF2 402b has a clock terminal that is coupled with the second frequency divider circuit 112b, and a control terminal that is coupled with the output terminal of the FF1 402a. The clock and control terminals of the FF2 402b are configured to receive the second frequency divided signal FD2 and the first FF output signal F1, respectively. The FF2 402b further has first and second output terminals that are configured to output the second and first clock signals CLK2 and CLK1, respectively. In an embodiment, the first and second output terminals correspond to positive and negative output terminals of the FF2 402b, respectively. The FF2 402b further has an input terminal that is coupled with the second output terminal of the FF2 402b. When the first FF output signal F1 is at a logic low state, the FF2 402b is operational and generates the second and first clock signals CLK2 and CLK1 at a positive clock edge of the second frequency divided signal FD2. Further, as the second output terminal of the FF2 402b is coupled with the input terminal of the FF2 402b, the second and first clock signals CLK2 and CLK1 toggle at each positive clock edge of the second frequency divided signal FD2. Thus, fourth and fifth frequencies of the second and first clock signals CLK2 and CLK1 are half of the third frequency of the second frequency divided signal FD2. The FF2 402b is non-operational when the first FF output signal F1 is at a logic high state.

The twelfth inverter I12 has an input terminal that is coupled with the second frequency divider circuit 112b, and is configured to receive the second frequency divided signal FD2. The twelfth inverter I12 further has an output terminal that is configured to output an inverted version of the second frequency divided signal IFD2 (hereinafter referred to as an "inverted second frequency divided signal IFD2").

The FF3 402c has a clock terminal that is coupled with the output terminal of the twelfth inverter I12, and a control terminal that is coupled with the output terminal of the FF1 402a. The clock terminal of the FF3 402c is configured to receive the inverted second frequency divided signal IFD2, and the control terminal of the FF3 402c is configured to receive the first FF output signal F1. The FF3 402c further has first and second output terminals that are configured to output second and third FF output signals F2 and F3, respectively, such that the second and third FF output signals F2 and F3 are complementary signals and have a 90-degree phase shift with respect to the second clock signal CLK2. In an embodiment, the first and second output terminals correspond to positive and negative output terminals of the FF3 402c, respectively. The FF3 402c further has an input terminal coupled with the second output terminal of the FF3 402c. When the first FF output signal F1 is at a logic low state, the FF3 402c is operational and generates the second and third FF output signals F2 and F3 at a positive clock edge of the inverted second frequency divided signal IFD2 (i.e., a negative clock edge of the second frequency divided signal FD2). Further, as the second output terminal of the FF3 402c is coupled with the input terminal of the FF3 402c, the second and third FF output signals F2 and F3 toggle at each positive clock edge of the inverted second frequency divided signal IFD2 (i.e., each negative clock edge of the second frequency divided signal FD2). The FF3 402c is non-operational when the first FF output signal F1 is at a logic high state.

The FF4 402d has an input terminal that is coupled with the first output terminal of the FF3 402c, a clock terminal that is coupled with the first frequency divider circuit 112a, and a control terminal that is coupled with the output terminal of the FF1 402a. The input, clock, and control terminals of the FF4 402d are configured to receive the second FF output signal F2, the first frequency divided signal FD1, and the first FF output signal F1, respectively. The FF4 402d further has an output terminal that is configured to output a fourth FF output signal F4. In an embodiment, the output terminal that outputs the fourth FF output signal F4 is a positive output terminal of the FF4 402d. When the first FF output signal F1 is at a logic low state, the FF4 402d is operational and generates the fourth FF output signal F4 at a positive clock edge of the first frequency divided signal FD1. Further, when the second FF output signal F2 is at a logic low state, the fourth FF output signal F4 is generated at a logic low state at positive edge of FD1 and when the second FF output signal F2 is at a logic high state, the fourth FF output signal F4 is generated at a logic high state at positive edge of FD1. The FF4 402d is non-operational when the first FF output signal F1 is at a logic high state.

The thirteenth inverter I13 has an input terminal that is coupled with the first frequency divider circuit 112a, and is configured to receive the first frequency divided signal FD1. The thirteenth inverter I13 further has an output terminal that is configured to output an inverted version of the first frequency divided signal IFD1 (hereinafter referred to as an "inverted first frequency divided signal IFD1").

The FF5 402e has an input terminal coupled with the output terminal of the FF4 402d, a clock terminal that is coupled with the thirteenth inverter I13, and a control terminal that is coupled with the output terminal of the FF1 402a. The input, clock, and control terminals of the FF5 402e are configured to receive the fourth FF output signal F4, the inverted first frequency divided signal IFD1, and the first FF output signal F1, respectively. The FF5 402e further has an output terminal that is configured to output a fifth FF output signal F5. In an embodiment, the output terminal that outputs the fifth FF output signal F5 is a negative output terminal of the FF5 402e. When the first FF output signal F1 is at a logic low state, the FF5 402e is operational and generates the fifth FF output signal F5 at a positive clock edge of the inverted first frequency divided signal IFD1 (i.e., a negative clock edge of the first frequency divided signal FD1). Further, when the fourth FF output signal F4 is at a logic low state, the fifth FF output signal F5 is generated at a logic high state at negative edge of FD1, and when the fourth FF output signal F4 is at a logic high state, the fifth FF output signal F5 is generated at a logic low state at negative edge of FD1. The FF5 402e is non-operational when the first FF output signal F1 is at a logic high state.

The first logic gate 404 has first and second input terminals that are coupled with the output terminal of the FF5 402e and the first output terminal of the FF3 402c, respectively. The first and second input terminals of the first logic gate 404 are configured to receive the fifth FF output signal F5 and the second FF output signal F2, respectively. The first logic gate 404 further has an output terminal that is configured to output the third clock signal CLK3.

The fourteenth inverter I14 has an input terminal that is coupled with the output terminal of the first logic gate 404, and is configured to receive the third clock signal CLK3. The fourteenth inverter I14 further has an output terminal that is configured to output the fourth clock signal CLK4 that is an inverted version of the third clock signal CLK3.

Figure 4B:
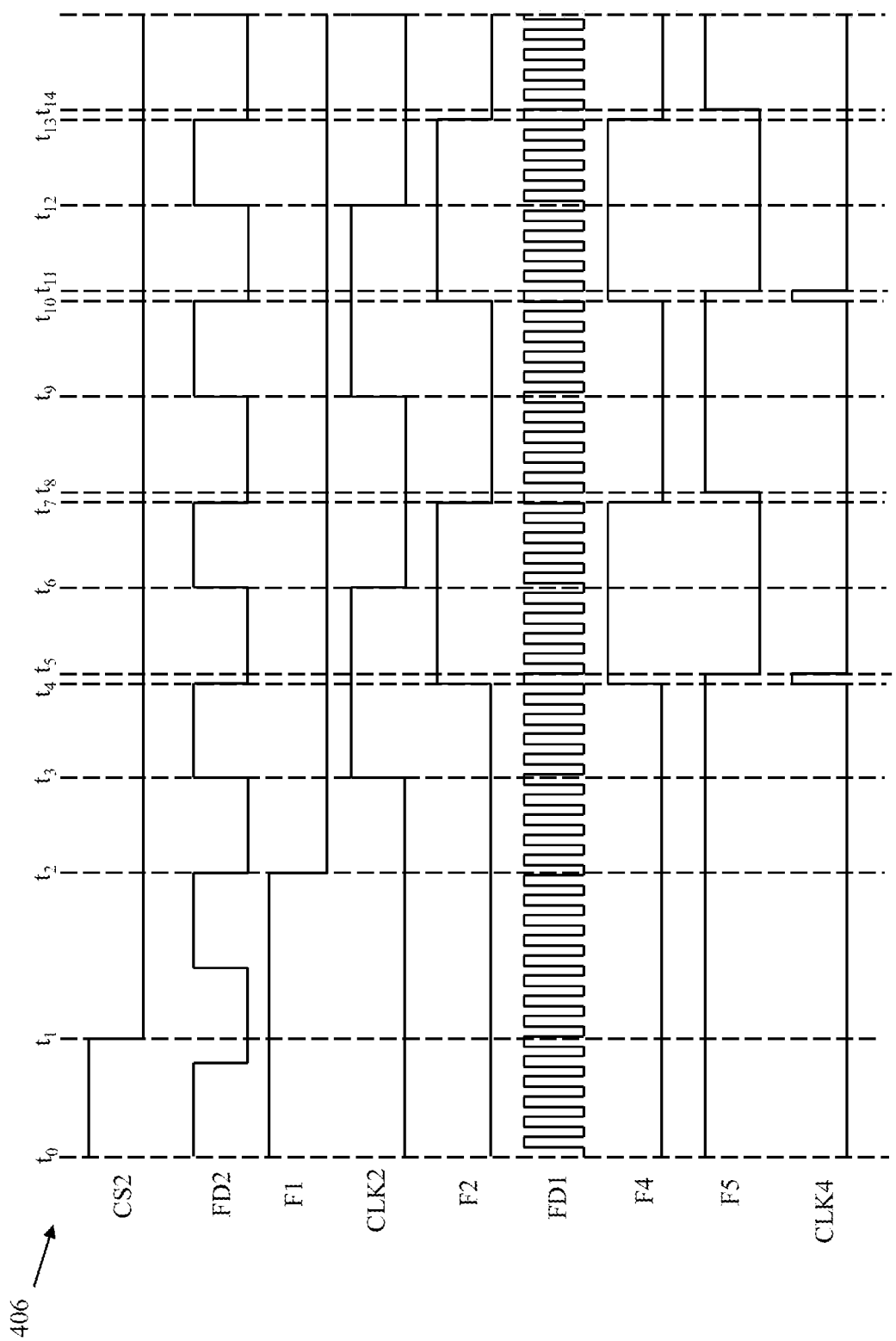
FIG. 4B is a timing diagram that illustrates an operation of the clock generator of FIG. 4A in accordance with an embodiment of the present disclosure.

Referring now to FIG. 4B, a timing diagram 406 that illustrates an operation of the clock generator 114 in accordance with an embodiment of the present disclosure is shown. During time period $t_0$-$t_1$, the second control signal CS2 is at a logic high state. Thus, the clock generator 114 is non-operational. Further, for the sake of ongoing discussion, it is assumed that during time period $t_0$-$t_1$, the first and fifth FF output signals F1 and F5 are at logic high states, and the second and fourth clock signals CLK2 and CLK4 and the second and fourth FF output signals F2 and F4 are at logic low states. Further, as time period $t_0$-$t_1$ is greater than time periods of the first and second frequency divided signals FD1 and FD2, the first frequency divided signal FD1 toggles between logic low and logic high states multiple times during time period $t_0$-$t_1$, and the second frequency divided signal FD2 toggles from a logic high state to a logic low state during time period $t_0$-$t_1$.

At time instance $t_1$, the second control signal CS2 transitions from a logic high state to a logic low state. The clock generator 114 is thus operational. As the second frequency divided signal FD2 is at a logic low state, the first FF output signal F1 is unchanged. During time period $t_1$-$t_2$, the first and fifth FF output signals F1 and F5 are at logic high states, and the second control signal CS2, the second and fourth clock signals CLK2 and CLK4, and the second and fourth FF output signals F2 and F4 are at logic low states. Further, the second frequency divided signal FD2 toggles from a logic low state to a logic high state.

At time instance $t_2$, the second frequency divided signal FD2 transitions from a logic high state to a logic low state. Thus, the first FF output signal F1 transitions from a logic high state to a logic low state. During time period $t_2$-$t_3$, the fifth FF output signal F5 is at a logic high state, and the second control signal CS2, the second frequency divided signal FD2, the first, second, and fourth FF output signals F1, F2, and F4, and the second and fourth clock signals CLK2 and CLK4 are at logic low states.

At time instance $t_3$, the second frequency divided signal FD2 transitions from a logic low state to a logic high state. Further, as the first FF output signal F1 is at a logic low state, the second clock signal CLK2 transitions from a logic low state to a logic high state. During time period $t_3$-$t_4$, the second frequency divided signal FD2, the second clock signal CLK2, and the fifth FF output signal F5 are at logic high states, and the second control signal CS2, the first, second, and fourth FF output signals F1, F2, and F4, and the fourth clock signal CLK4 are at logic low states. Further, the first frequency divided signal FD1 toggles between logic low and logic high states multiple times during time period $t_1$-$t_4$.

At time instance $t_4$, the second frequency divided signal FD2 transitions from a logic high state to a logic low state. Thus, the second FF output signal F2 transitions from a logic low state to a logic high state. Further, the first frequency divided signal FD1 transitions from a logic low state to a logic high state. As the second FF output signal F2 transitions from a logic low state to a logic high state, the fourth FF output signal F4 transitions from a logic low state to a logic high state. As the second and fifth FF output signals F2 and F5 are at logic high states, the fourth clock signal CLK4 transitions from a logic low state to a logic high state. During time period $t_4$-$t_5$, the second and fourth clock signals CLK2 and CLK4, the first frequency divided signal FD1, and the second, fourth, and fifth FF output signals F2, F4, and F5 are at logic high states, and the second control signal CS2, the second frequency divided signal FD2, and the first FF output signal F1 are at logic low states.

At time instance $t_5$, the first frequency divided signal FD1 transitions from a logic high state to a logic low state. As the fourth FF output signal F4 is at a logic high state, the fifth FF output signal F5 transitions from a logic high state to a logic low state. As a result, the fourth clock signal CLK4 transitions from a logic high state to a logic low state. Thus, a pulse width of the fourth clock signal CLK4 is equal to half of the time period of the first frequency divided signal FD1. During time period $t_5$-$t_6$, the second clock signal CLK2 and the second and fourth FF output signals F2 and F4 are at logic high states, and the second control signal CS2, the second frequency divided signal FD2, the first and fifth FF output signals F1 and F5, and the fourth clock signal CLK4 are at logic low states.

At time instance $t_6$, the second frequency divided signal FD2 transitions from a logic low state to a logic high state. As the first FF output signal F1 is at a logic low state, the second clock signal CLK2 transitions from a logic high state to a logic low state. During time period $t_6$-$t_7$, the second frequency divided signal FD2 and the second and fourth FF output signals F2 and F4 are at logic high states, and the second control signal CS2, the first and fifth FF output signals F1 and F5, and the second and fourth clock signals CLK2 and CLK4 are at logic low states. Further, the first frequency divided signal FD1 toggles between logic low and logic high states multiple times during time period $t_5$-$t_7$.

At time instance $t_7$, the second frequency divided signal FD2 transitions from a logic high state to a logic low state.

As a result, the second FF output signal F2 transitions from a logic high state to a logic low state. Further, the first frequency divided signal FD1 transitions from a logic low state to a logic high state. As the second FF output signal F2 transitions from a logic high state to a logic low state, the fourth FF output signal F4 transitions from a logic high state to a logic low state. During time period $t_7$-$t_8$, the first frequency divided signal FD1 is at a logic high state, and the second control signal CS2, the second frequency divided signal FD2, the first, second, fourth, and fifth FF output signals F1, F2, F4, and F5, and the second and fourth clock signals CLK2 and CLK4 are at logic low states.

At time instance $t_8$, the first frequency divided signal FD1 transitions from a logic high state to a logic low state. As the fourth FF output signal F4 is at a logic low state, the fifth FF output signal transitions from a logic low state to a logic high state. During time period $t_8$-$t_9$, the fifth FF output signal F5 is at a logic high state, and the second control signal CS2, the second frequency divided signal FD2, the first, second, and fourth FF output signals F1, F2, and F4, and the second and fourth clock signals CLK2 and CLK4 are at logic low states. Further, the first frequency divided signal FD1 toggles between logic low and logic high states multiple times during time period $t_8$-$t_9$.

The operation of the clock generator 114 during time period $t_9$-$t_{14}$ is similar to the operation of the clock generator 114 during time period $t_3$-$t_8$ as described above. Further, it will be apparent to a person skilled in the art that the transitions of various signals illustrated in FIG. 4B are sans set up time associated with each signal to make the illustrations concise and clear and should not be considered as a limitation of the present disclosure.

The duty cycle detection signal DS is generated by the duty cycle detector 110 based on the second and fourth clock signals CLK2 and CLK4. When the second clock signal CLK2 is at a logic low state (i.e., during time periods $t_0$-$t_3$ and $t_6$-$t_9$), the auto-zero preamplifier 304 of the duty cycle detector 110 operates in the auto-zero phase. Similarly, when the second clock signal CLK2 is at a logic high state (i.e., during time period $t_3$-$t_6$), the auto-zero preamplifier 304 operates in the amplification phase. Similarly, the comparator 306 is operational during time period $t_4$-$t_5$ (as the fourth clock signal CLK4 is at a logic high state during time period $t_4$-$t_5$), and non-operational during time periods $t_0$-$t_3$ and $t_5$-$t_9$. Thus, during time period $t_0$-$t_3$, the offset voltage of the amplification circuit 310 is stored in the third and fourth capacitors C3 and C4. Further, at time instance $t_3$, the stored offset voltage is added to the voltage levels of the first and second LPF output signals L1 and L2 to cancel out the offset voltage of the amplification circuit 310, and generate the first and second preamplifier output signals PRE1 and PRE2. The duty cycle detection signal DS is outputted at time instance $t_4$ as the comparator 306 is activated at time instance $t_4$, and is received by the correction bit generator 118. The correction bit generator 118 generates the first and second sets of correction bits B1[N:0] and B2[N:0] and the third and fourth correction bits B3 and B4 at the negative clock edge of the fourth clock signal CLK4, i.e., at time instance $t_5$. The duty cycle adjuster 108 utilizes the first and second sets of correction bits B1[N:0] and B2[N:0] and the third and fourth correction bits B3 and B4 generated at time instance $t_5$ to adjust the first and second duty cycles. Thus, time period $t_5$-$t_{11}$ corresponds to an iteration of the duty cycle adjustment.

Figure 5:
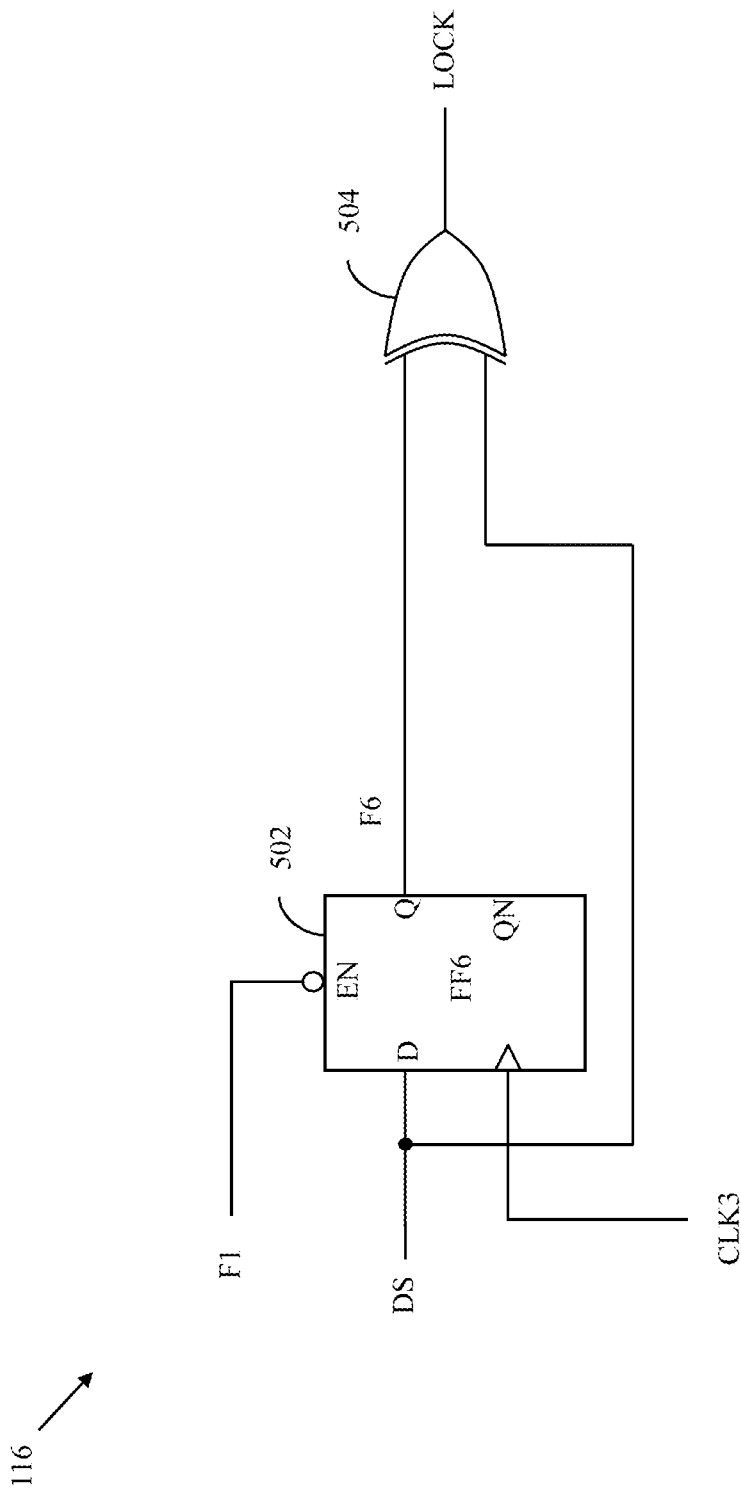
FIG. 5 is a schematic circuit diagram of a lock signal generator of the SoC of FIG. 1 in accordance with an embodiment of the present disclosure.

Referring now to FIG. 5, a schematic circuit diagram of the lock signal generator 116 in accordance with an embodiment of the present disclosure is shown. The lock signal generator 116 includes a sixth FF (FF6) 502 and a second logic gate 504. In an embodiment, the FF6 502 is a D FF and the second logic gate 504 is an exclusive OR (XOR) gate.

The FF6 502 has an input terminal that is coupled with the duty cycle detector 110 (i.e., the comparator 306), a clock terminal that is coupled with the output terminal of the first logic gate 404, and a control terminal that is coupled with the output terminal of the FF1 402a. The input, clock, and control terminals of the FF6 502 are configured to receive the duty cycle detection signal DS, the third clock signal CLK3, and the first FF output signal F1, respectively. The FF6 502 further has an output terminal that is configured to output a sixth FF output signal F6. In an embodiment, the output terminal is a positive output terminal of the FF6 502. When the first FF output signal F1 is at a logic low state, the FF6 502 is operational and generates the sixth FF output signal F6 at a positive clock edge of the third clock signal CLK3 (i.e., a negative clock edge of the fourth clock signal CLK4). Further, when the duty cycle detection signal DS is at a logic low state, the sixth FF output signal F6 is generated at a logic low state, and when the duty cycle detection signal DS is at a logic high state, the sixth FF output signal F6 is generated at a logic high state. The FF6 502 is non-operational when the first FF output signal F1 is at a logic high state.

The second logic gate 504 has first and second input terminals that are coupled with the duty cycle detector 110 (i.e., the comparator 306) and the output terminal of the FF6 502, respectively. The first and second input terminals of the second logic gate 504 are configured to receive the duty cycle detection signal DS and the sixth FF output signal F6, respectively. The second logic gate 504 further has an output terminal that is configured to output the lock signal LOCK. For example, the duty cycle detection signal DS generated by the comparator 306 at time instance $t_{10}$ is compared with the sixth FF output signal F6 generated by the FF6 502 at time instance $t_5$ to generate the lock signal LOCK. When the logic state of the duty cycle detection signal DS received during one iteration of the duty cycle adjustment is different than the logic state of the duty cycle detection signal DS received during an immediately previous iteration (i.e., the duty cycle detection signal DS toggles between two iterations), the lock signal LOCK is generated at a logic high state. When the logic states of the duty cycle detection signals DS received during two consecutive iterations are same, the lock signal LOCK is generated at a logic low state.

Thus, the duty cycle correction circuit 106 provides a closed loop duty cycle correction for correcting the duty cycle distortion of the first and second differential input signals D1 and D2. The correction of the duty cycle distortion thus significantly reduces errors introduced in an operation of the SoC 100, and improves a reliability of the SoC 100. Further, upon successful correction of the duty cycle distortion, the duty cycle detector 110, the clock generator 114, the lock signal generator 116, and the correction bit generator 118 are deactivated. This ensures that power consumed by the duty cycle correction circuit 106 is less as compared to power consumed by conventional duty cycle correction circuits. Thus, the power consumed by the SoC 100 is less as compared to power consumed by SoCs implementing conventional duty cycle correction circuits. Further, the auto-zero preamplifier 304, in conjunction with the low pass filtering circuit 302, amplify the first and second differential output signals O1 and O2 to generate the first and second preamplifier output signals PRE1 and PRE2, respectively, such that the difference between the voltage levels of the first and second preamplifier output signals PRE1 and PRE2 is greater than the offset voltage of the comparator 306. As a result, the comparator 306 is enabled to accurately detect a significantly small difference between the third and fourth duty cycles (e.g., 0.2%, 0.3%, or the like). Thus, an accuracy of the duty cycle correction of the duty cycle correction circuit 106 is greater than that of the conventional duty cycle correction circuits. As a result, the duty cycle correction circuit 106 may be implemented in SoCs (such as the SoC 100) that have high frequencies of operations (e.g., frequencies greater than 1 gigahertz) for accurately correcting the duty cycle distortion.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims.

The invention claimed is:

1. A duty cycle correction circuit, comprising:
    a duty cycle adjuster that is configured to receive and iteratively adjust first and second differential input signals having first and second duty cycles, respectively, based on a plurality of correction bits, to generate first and second differential output signals having third and fourth duty cycles, respectively;
    a lock signal generator that is configured to receive a duty cycle detection signal that is generated based on a comparison of the first and second differential output signals, and generate a lock signal, wherein the lock signal is activated when the duty cycle detection signal toggles based on the third and fourth duty cycles, between a first logic state and a second logic state; and
    a correction bit generator that is configured to generate and adjust the plurality of correction bits based on the duty cycle detection signal and the lock signal, and provide the plurality of correction bits to the duty cycle adjuster.

2. The duty cycle correction circuit of claim 1, wherein the duty cycle adjuster includes a first plurality of transmission gate arrays that are configured to receive first and second sets of correction bits and a third correction bit of the plurality of correction bits, and a second plurality of transmission gate arrays that are configured to receive the first and second sets of correction bits and a fourth correction bit of the plurality of correction bits, and wherein:
    each transmission gate array of the first plurality of transmission gate arrays includes:
        first and second transmission gates having first and second control terminals that are configured to receive corresponding correction bits of the first and second sets of correction bits, respectively, wherein the first transmission gate further has a first data terminal that is configured to receive a supply voltage, and the second transmission gate further has a first data terminal that is coupled with ground; and
        third and fourth transmission gates having first and second control terminals that are configured to receive the corresponding correction bits of the second and first sets of correction bits, respectively, first data terminals that are configured to receive the third correction bit, and second data terminals that are coupled with second data terminals of the first and second transmission gates, and are configured to output first and second intermediate signals, respectively; and
    each transmission gate array of the second plurality of transmission gate arrays includes:
        fifth and sixth transmission gates having first and second control terminals that are configured to receive the corresponding correction bits of the first and second sets of correction bits, respectively, wherein the fifth transmission gate further has a first data terminal that is configured to receive the supply voltage, and the sixth transmission gate further has a first data terminal that is coupled with ground; and
        seventh and eighth transmission gates having first and second control terminals that are configured to receive the corresponding correction bits of the second and first sets of correction bits, respectively, first data terminals that are configured to receive the fourth correction bit, and second data terminals that are coupled with second data terminals of the fifth and sixth transmission gates, and are configured to output third and fourth intermediate signals, respectively.

3. The duty cycle correction circuit of claim 2, wherein the duty cycle adjuster further includes:
    first and second inverters having input terminals that are configured to receive the first and second differential input signals, respectively, and output terminals that are configured to output fifth and sixth intermediate signals that are inverted versions of the first and second differential input signals, respectively;
    third and fourth inverters having input terminals that are coupled with the output terminals of the first and second inverters, and are configured to receive the fifth and sixth intermediate signals, respectively, and output terminals that are configured to output seventh and eighth intermediate signals that are inverted versions of the fifth and sixth intermediate signals, respectively;
    first and second pluralities of tristate inverters, wherein:
        each tristate inverter of the first plurality of tristate inverters has first and second input terminals that are coupled with a corresponding transmission gate array of the first plurality of transmission gate arrays, and are configured to receive the first and second intermediate signals, respectively, a third input terminal that is coupled with the output terminal of the first inverter, and is configured to receive the fifth intermediate signal, and an output terminal that is coupled with the output terminal of the third inverter; and
        each tristate inverter of the second plurality of tristate inverters has first and second input terminals that are coupled with a corresponding transmission gate array of the second plurality of transmission gate arrays, and are configured to receive the third and fourth intermediate signals, respectively, a third input terminal that is coupled with the output terminal of the second inverter, and is configured to receive the sixth intermediate signal, and an output terminal that is coupled with the output terminal of the fourth inverter, and
    fifth and sixth inverters having input terminals that are coupled with the output terminals of the third and fourth inverters, and are configured to receive the seventh and eighth intermediate signals, respectively, and output terminals that are configured to output the second and first differential output signals, respectively.

4. The duty cycle correction circuit of claim 3, wherein the duty cycle adjuster further includes:
  a first pair of back-to-back inverters having a first node coupled with the output terminal of the first inverter and the input terminal of the third inverter, and a second node coupled with the output terminal of the second inverter and the input terminal of the fourth inverter; and
  a second pair of back-to-back inverters having a third node coupled with the output terminal of the third inverter and the input terminal of the fifth inverter, and a fourth node coupled with the output terminal of the fourth inverter and the input terminal of the sixth inverter.

5. The duty cycle correction circuit of claim 1, further comprising a duty cycle detector that is coupled with the duty cycle adjuster, and is configured to receive the first and second differential output signals and a plurality of clock signals, and compare the third and fourth duty cycles based on the plurality of clock signals to generate the duty cycle detection signal, wherein when the third duty cycle is greater than the fourth duty cycle, the duty cycle detection signal is at the first logic state, and when the third duty cycle is less than the fourth duty cycle, the duty cycle detection signal is at the second logic state.

6. The duty cycle correction circuit of claim 5, wherein the duty cycle detector includes:
  a low pass filtering circuit that is coupled with the duty cycle adjuster, and is configured to receive the first and second differential output signals, and output first and second low pass filter (LPF) output signals;
  an auto-zero preamplifier that is coupled with the low pass filtering circuit, and is configured to receive the first and second LPF output signals and first and second clock signals of the plurality of clock signals, and amplify, based on the first and second clock signals, the first and second LPF output signals to generate first and second preamplifier output signals, respectively, wherein the first and second clock signals are complementary signals; and
  a comparator that is coupled with the auto-zero preamplifier, and is configured to receive the first and second preamplifier output signals and third and fourth clock signals of the plurality of clock signals, and generate the duty cycle detection signal.

7. The duty cycle correction circuit of claim 6, wherein the comparator is an Armstrong comparator.

8. The duty cycle correction circuit of claim 6, wherein the low pass filtering circuit includes:
  a first LPF comprising:
    a first resistor having a first terminal that is coupled with the duty cycle adjuster, and is configured to receive the first differential output signal, and a second terminal that is configured to output the first LPF output signal;
    a first transistor having first and second terminals that are coupled with the first and second terminals of the first resistor, respectively, and a gate terminal that is coupled with the first terminal of the first resistor;
    a second transistor having first and second terminals that are coupled with the second and first terminals of the first resistor, respectively, and a gate terminal that is coupled with the second terminal of the first resistor; and
    a first capacitor having a first terminal that is coupled with the second terminal of the first resistor, and a second terminal that is coupled with ground; and
  a second LPF comprising:
    a second resistor having a first terminal that is coupled with the duty cycle adjuster, and is configured to receive the second differential output signal, and a second terminal that is configured to output the second LPF output signal;
    a third transistor having first and second terminals that are coupled with the first and second terminals of the second resistor, respectively, and a gate terminal that is coupled with the first terminal of the second resistor;
    a fourth transistor having first and second terminals that are coupled with the second and first terminals of the second resistor, respectively, and a gate terminal that is coupled with the second terminal of the second resistor; and
    a second capacitor having a first terminal that is coupled with the second terminal of the second resistor, and a second terminal that is coupled with ground.

9. The duty cycle correction circuit of claim 6, wherein the auto-zero preamplifier includes:
  ninth and tenth transmission gates having first data terminals that are coupled with the low pass filtering circuit, and are configured to receive the first and second LPF output signals, respectively, and first and second control terminals that are configured to receive the first and second clock signals, respectively;
  eleventh and twelfth transmission gates having first and second control terminals that are configured to receive the second and first clock signals, respectively, first data terminals that are configured to receive a reference voltage signal, and second data terminals that are coupled with second data terminals of the ninth and tenth transmission gates, respectively;
  third and fourth capacitors having first terminals that are coupled with the second data terminals of the eleventh and twelfth transmission gates, respectively; and
  thirteenth and fourteenth transmission gates having first data terminals that are coupled with second terminals of the third and fourth capacitors, respectively, and first and second control terminals that are configured to receive the second and first clock signals, respectively.

10. The duty cycle correction circuit of claim 9, wherein the auto-zero preamplifier further includes an amplification circuit having first and second input terminals that are coupled with the second terminals of the third and fourth capacitors, respectively, and first and second output terminals that are coupled with second data terminals of the thirteenth and fourteenth transmission gates and the comparator, and are configured to output the first and second preamplifier output signals, respectively, and wherein:
  when the first clock signal is at a logic high state,
    (i) the ninth and tenth transmission gates are deactivated and the eleventh through fourteenth transmission gates are activated, and
    (ii) the third and fourth capacitors store an offset voltage of the amplification circuit; and
  when the second clock signal is at a logic high state,
    (i) the ninth and tenth transmission gates are activated and the eleventh through fourteenth transmission gates are deactivated, and
    (ii) the amplification circuit amplifies the first and second LPF output signals to output the first and second preamplifier output signals, respectively.

11. The duty cycle correction circuit of claim 6, further comprising:

a first frequency divider circuit that is configured to receive the first differential input signal, and generate a first frequency divided signal, wherein a first frequency of the first differential input signal is greater than a second frequency of the first frequency divided signal; and a second frequency divider circuit that is coupled with the first frequency divider circuit, and is configured to receive the first frequency divided signal, and generate a second frequency divided signal, wherein the second frequency is greater than a third frequency of the second frequency divided signal.

12. The duty cycle correction circuit of claim 11, further comprising:
a clock generator, comprising
a first flip-flop (FF) having input and control terminals that are configured to receive a first control signal, a clock terminal that is coupled with the second frequency divider circuit, and is configured to receive the second frequency divided signal, and an output terminal that is configured to output a first FF output signal; and
a second FF having a clock terminal that is coupled with the second frequency divider circuit, and is configured to receive the second frequency divided signal, a control terminal that is coupled with the output terminal of the first FF, and is configured to receive the first FF output signal, and first and second output terminals that are configured to output the second and first clock signals, respectively, wherein the second FF further has an input terminal that is coupled with the second output terminal of the second FF.

13. The duty cycle correction circuit of claim 12, wherein based on the lock signal, the correction bit generator is further configured to generate the first control signal and a second control signal, and provide the first and second control signals to the clock generator and the duty cycle detector to control operations of the clock generator and the duty cycle detector, respectively, and wherein when the lock signal is activated, the correction bit generator generates the first and second control signals such that the clock generator and the duty cycle detector are deactivated, respectively.

14. The duty cycle correction circuit of claim 12, wherein the clock generator further includes:
a third FF having a clock terminal that is configured to receive an inverted version of the second frequency divided signal, a control terminal that is coupled with the output terminal of the first FF, and is configured to receive the first FF output signal, and first and second output terminals that are configured to output second and third FF output signals, respectively, wherein the second and third FF output signals are complementary signals, and wherein the third FF further has an input terminal that is coupled with the second output terminal of the third FF;
a fourth FF having an input terminal that is coupled with the first output terminal of the third FF, and is configured to receive the second FF output signal, a clock terminal that is coupled with the first frequency divider circuit, and is configured to receive the first frequency divided signal, a control terminal that is coupled with the output terminal of the first FF, and is configured to receive the first FF output signal, and an output terminal that is configured to output a fourth FF output signal;

a fifth FF having an input terminal that is coupled with the output terminal of the fourth FF, and is configured to receive the fourth FF output signal, a clock terminal that is configured to receive an inverted version of the first frequency divided signal, a control terminal that is coupled with the output terminal of the first FF, and is configured to receive the first FF output signal, and an output terminal that is configured to output a fifth FF output signal;
a first logic gate having first and second input terminals that are coupled with the output terminal of the fifth FF and the first output terminal of the third FF, and are configured to receive the fifth FF output signal and the second FF output signal, respectively, and an output terminal that is configured to output the third clock signal; and
a seventh inverter having an input terminal that is coupled with the output terminal of the first logic gate, and is configured to receive the third clock signal, and an output terminal that is configured to output the fourth clock signal.

15. The duty cycle correction circuit of claim 14, wherein the clock generator further includes:
an eighth inverter having an input terminal that is coupled with the second frequency divider circuit, and is configured to receive the second frequency divided signal, and an output terminal that is configured to output the inverted version of the second frequency divided signal; and
a ninth inverter having an input terminal that is coupled with the first frequency divider circuit, and is configured to receive the first frequency divided signal, and an output terminal that is configured to output the inverted version of the first frequency divided signal.

16. The duty cycle correction circuit of claim 14, wherein the lock signal generator includes:
a sixth FF having an input terminal that is coupled with the duty cycle detector, and is configured to receive the duty cycle detection signal, clock and control terminals that are coupled with the clock generator and are configured to receive the third clock signal and the first FF output signal, respectively, and an output terminal that is configured to output a sixth FF output signal; and
a second logic gate having first and second input terminals that are coupled with the duty cycle detector and the output terminal of the sixth FF, respectively, and are configured to receive the duty cycle detection signal and the sixth FF output signal, respectively, and an output terminal that is configured to output the lock signal.

17. The duty cycle correction circuit of claim 1, wherein the plurality of correction bits include first and second sets of correction bits, and wherein:
(i) prior to the activation of the lock signal, a first set of bit values of the first and second sets of correction bits are iteratively adjusted such that a difference between the third and fourth duty cycles decreases after each iteration, wherein after each iteration, the first set of bit values are provided to the duty cycle adjuster, and wherein the duty cycle adjuster iteratively adjusts the first and second differential input signals having the first and second duty cycles, respectively, based on the first set of bit values received after each iteration, and
(ii) when the lock signal is activated, the first set of bit values associated with a first iteration that is immediately previous to a second iteration associated with the activation of the lock signal are provided to the duty cycle adjuster, wherein based on the received first set of bit values, the duty cycle adjuster generates the first and second differential output signals such that the difference between the third and fourth duty cycles is less than a predefined threshold value.

18. A system-on-chip (SoC), comprising:
a phased locked loop (PLL) that is configured to generate an input signal;
a set of buffers that is coupled with the PLL, and is configured to receive the input signal, and generate a first differential input signal; and
a duty cycle correction circuit that is coupled with the set of buffers, the duty cycle correction circuit comprising:
  a duty cycle adjuster that is configured to receive and iteratively adjust the first differential input signal and an inverted version of the first differential input signal having first and second duty cycles, respectively, based on a plurality of correction bits, to generate first and second differential output signals having third and fourth duty cycles, respectively;
  a lock signal generator that is configured to receive a duty cycle detection signal that is generated based on a comparison of the first and second differential output signals, and generate a lock signal, wherein the lock signal is activated when the duty cycle detection signal toggles based on the third and fourth duty cycles, between a first logic state and a second logic state; and
  a correction bit generator that is configured to generate and adjust the plurality of correction bits based on the duty cycle detection signal and the lock signal, and provide the plurality of correction bits to the duty cycle adjuster.

19. The SoC of claim 18, wherein the duty cycle correction circuit further includes a duty cycle detector that is coupled with the duty cycle adjuster, and is configured to receive the first and second differential output signals and a plurality of clock signals, and compare the third and fourth duty cycles based on the plurality of clock signals to generate the duty cycle detection signal, and wherein when the third duty cycle is greater than the fourth duty cycle, the duty cycle detection signal is at the first logic state, and when the third duty cycle is less than the fourth duty cycle, the duty cycle detection signal is at the second logic state.

20. The SoC of claim 18, wherein the plurality of correction bits include first and second sets of correction bits, and wherein:
  (i) prior to the activation of the lock signal, a first set of bit values of the first and second sets of correction bits are iteratively adjusted such that a difference between the third and fourth duty cycles decreases after each iteration, wherein after each iteration, the first set of bit values are provided to the duty cycle adjuster, and wherein the duty cycle adjuster iteratively adjusts the first and second differential input signals having the first and second duty cycles, respectively, based on the first set of bit values received after each iteration, and
  (ii) when the lock signal is activated, the first set of bit values associated with a first iteration that is immediately previous to a second iteration associated with the activation of the lock signal are provided to the duty cycle adjuster, wherein based on the received first set of bit values, the duty cycle adjuster generates the first and second differential output signals such that the difference between the third and fourth duty cycles is less than a predefined threshold value.

* * * * *